(12) United States Patent
Yoneda et al.

(10) Patent No.: US 8,419,995 B2
(45) Date of Patent: Apr. 16, 2013

(54) IMPRINT METHOD

(75) Inventors: Ikuo Yoneda, Yokohama (JP); Kentaro Matsunaga, Kawasaki (JP); Yukiko Kikuchi, Fujisawa (JP); Yoshihisa Kawamura, Yokohama (JP); Eishi Shiobara, Yokohama (JP); Shinichi Ito, Yokohama (JP); Tetsuro Nakasugi, Yokohama (JP); Hirokazu Kato, Kariya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 248 days.

(21) Appl. No.: 12/563,461

(22) Filed: Sep. 21, 2009

(65) Prior Publication Data
US 2010/0078860 A1    Apr. 1, 2010

(30) Foreign Application Priority Data

Sep. 26, 2008  (JP) ................. 2008-249167
Mar. 13, 2009  (JP) ................. 2009-061650

(51) Int. Cl.
*B28B 11/08*    (2006.01)
*B29C 35/08*    (2006.01)

(52) U.S. Cl.
USPC ............................ 264/293; 264/496; 977/887

(58) Field of Classification Search .................. 264/293, 264/497; 977/877
See application file for complete search history.

(56) References Cited

U.S. PATENT DOCUMENTS

| | | | |
|---|---|---|---|
| 6,218,316 B1 | 4/2001 | Marsh | |
| 2004/0022888 A1* | 2/2004 | Sreenivasan et al. | 425/174.4 |
| 2004/0090610 A1* | 5/2004 | Hatakeyama et al. | 355/67 |
| 2004/0192041 A1* | 9/2004 | Jeong et al. | 438/689 |
| 2006/0188823 A1* | 8/2006 | Jackson et al. | 430/313 |
| 2006/0231979 A1 | 10/2006 | Santen et al. | |
| 2006/0237881 A1* | 10/2006 | Guo et al. | 264/496 |
| 2006/0279004 A1* | 12/2006 | Suehira et al. | 257/797 |
| 2007/0037410 A1* | 2/2007 | Chang et al. | 438/780 |

(Continued)

FOREIGN PATENT DOCUMENTS

| FR | 1580370 | * 2/1970 |
|---|---|---|
| JP | 2000-194142 | 7/2000 |

(Continued)

OTHER PUBLICATIONS

Notice of Reasons for Rejection by the Japanese Patent Office mailed Jun. 7, 2011, for Japanese Patent Application No. 2009-061650 and an English language translation.

*Primary Examiner* — Yogendra Gupta
*Assistant Examiner* — Jeremiah Smith
(74) *Attorney, Agent, or Firm* — Finnegan, Henderson, Farabow, Garrett & Dunner, LLP

(57) ABSTRACT

An imprint method includes applying a light curable resin on a substrate to be processed, the substrate including first and second regions on which the light curable resin is applied, contacting an imprint mold with the light curable resin, curing the light curable resin by irradiating the light curable resin with light passing through the imprint mold, generating gas by performing a predetermined process to the light curable resin applied on a region of the substrate, the region including at least the first region, wherein an amount of gas generated from the light curable resin applied on the first region is larger than an amount of gas generated from the light curable resin of the second region, and forming a pattern by separating the imprint mold from the light curable resin after the gas being generated.

13 Claims, 22 Drawing Sheets

U.S. PATENT DOCUMENTS

| | | | |
|---|---|---|---|
| 2007/0054097 A1* | 3/2007 | Suehira et al. | 428/195.1 |
| 2007/0066750 A1* | 3/2007 | Houle et al. | 524/588 |
| 2007/0092594 A1* | 4/2007 | Ho et al. | 425/444 |
| 2007/0267764 A1* | 11/2007 | Morimoto | 264/1.1 |
| 2008/0164638 A1 | 7/2008 | Zhang | |
| 2008/0167396 A1 | 7/2008 | Murao | |

FOREIGN PATENT DOCUMENTS

| | | |
|---|---|---|
| JP | 2005-64143 | 3/2005 |
| JP | 2006-216065 | 6/2006 |
| JP | 2008-201020 A * | 9/2008 |
| WO | WO 2010/005032 | 1/2010 |

* cited by examiner

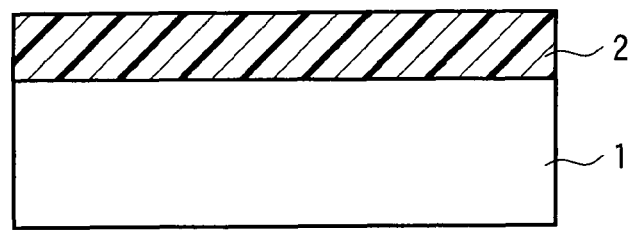
F I G. 1
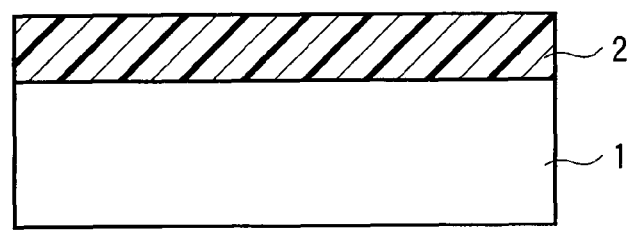
F I G. 2
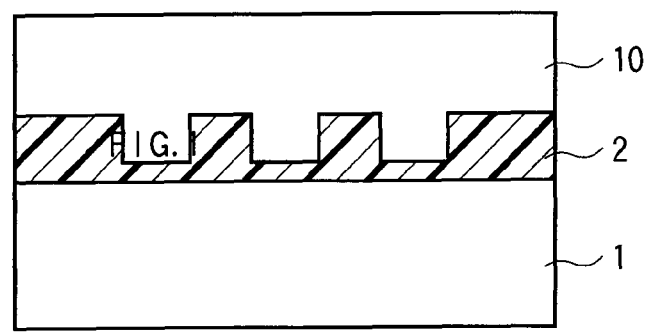
F I G. 3

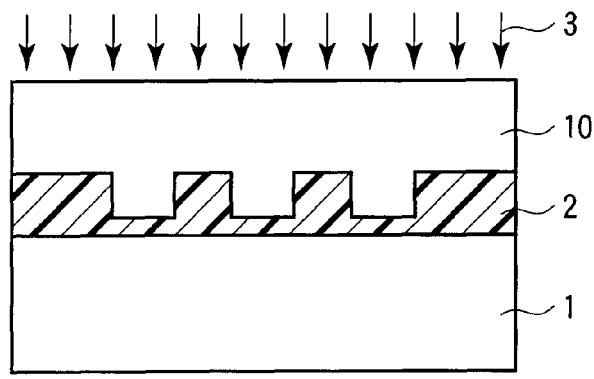
F I G. 4
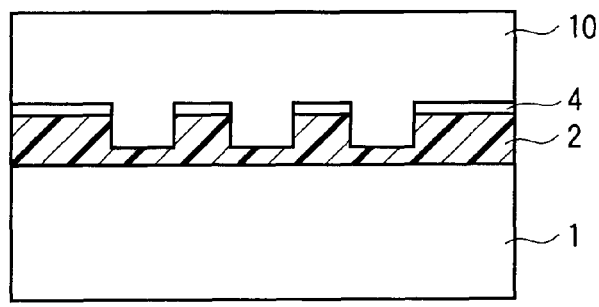
F I G. 5
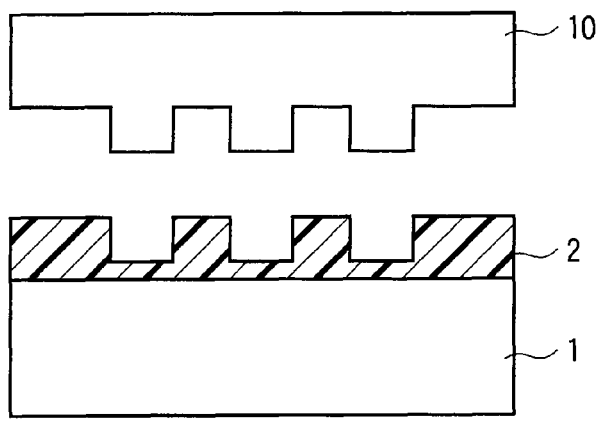
F I G. 6

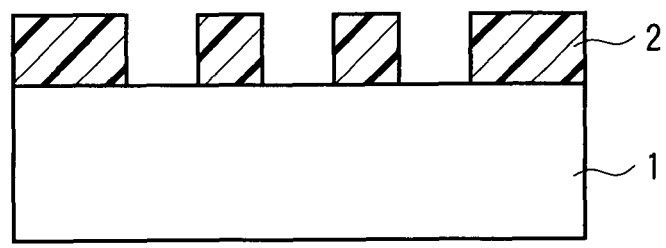
F I G. 7
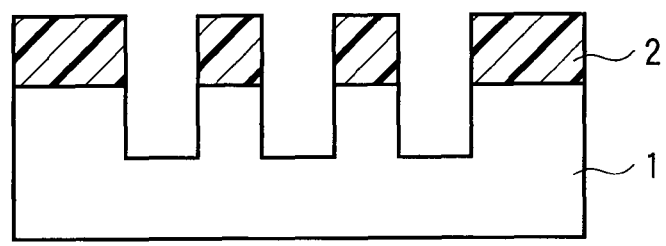
F I G. 8
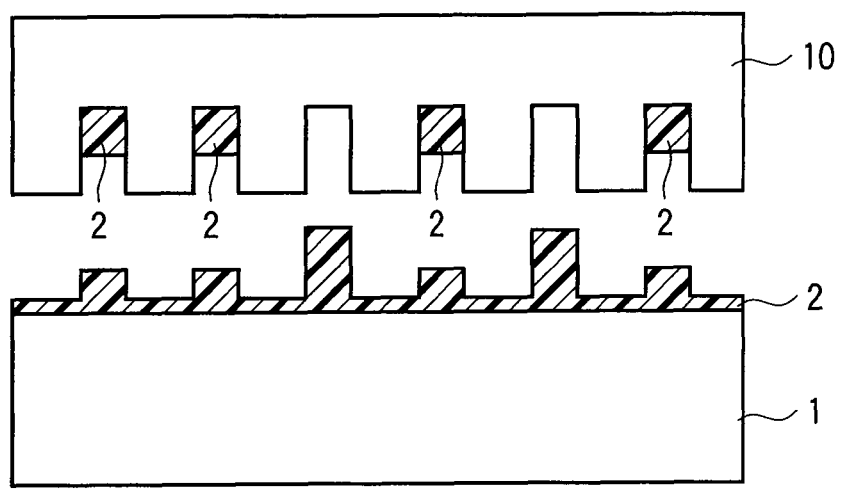
F I G. 9

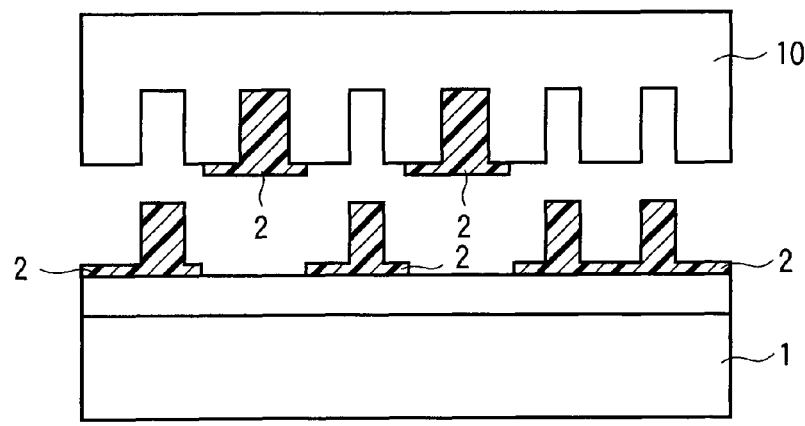
F I G. 10
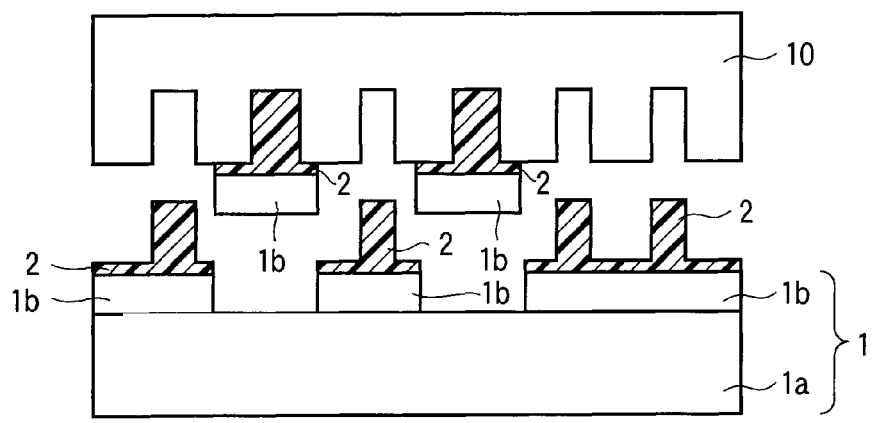
F I G. 11
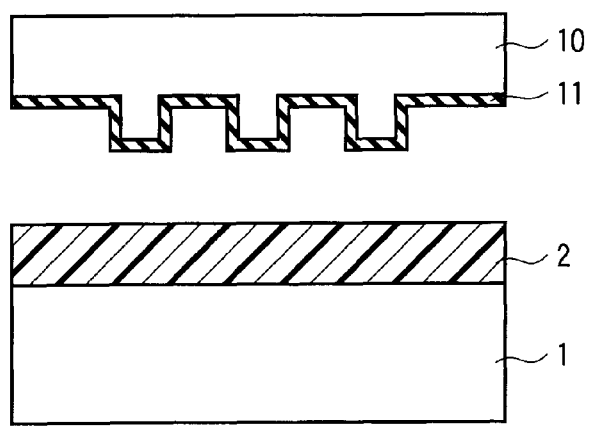
F I G. 12

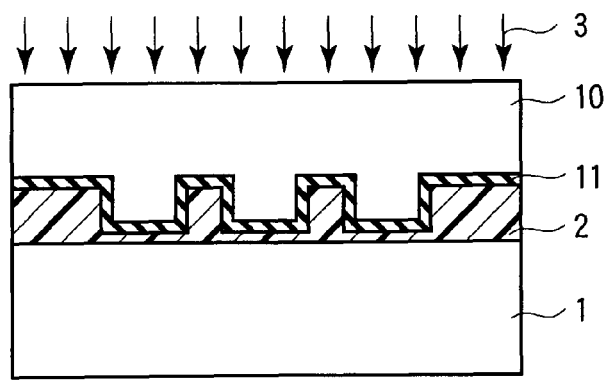
F I G. 13
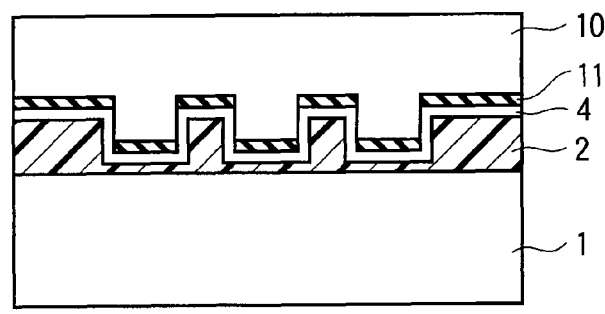
F I G. 14
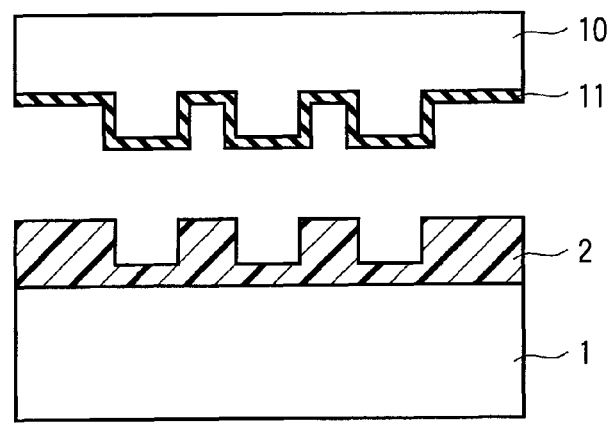
F I G. 15

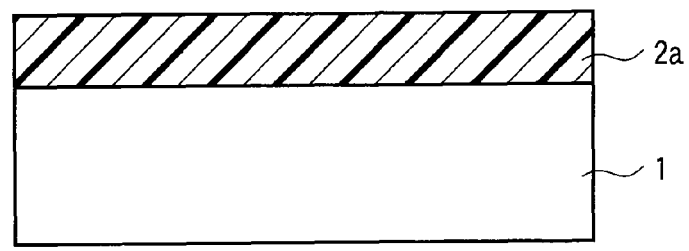
F I G. 16
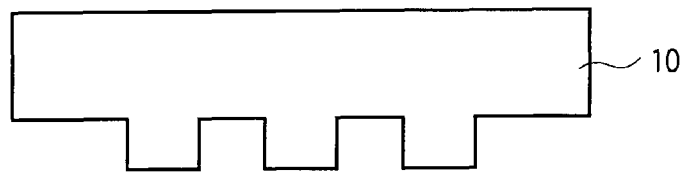
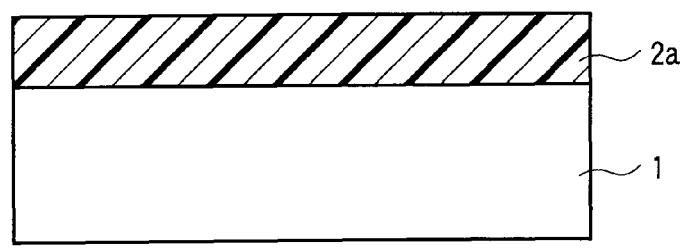
F I G. 17
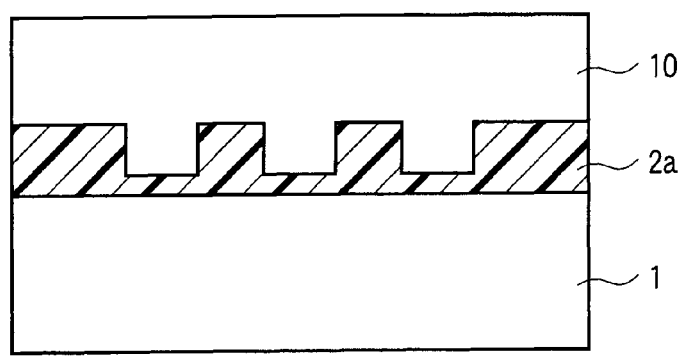
F I G. 18

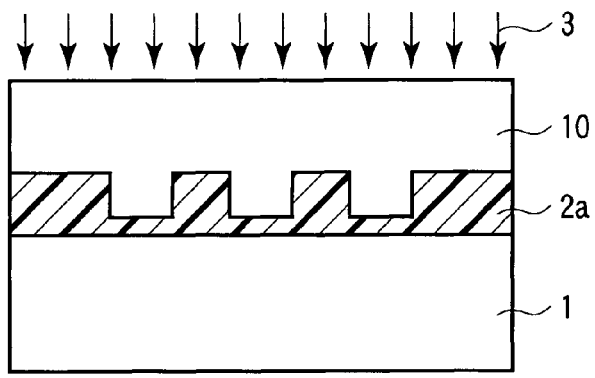
F I G. 19
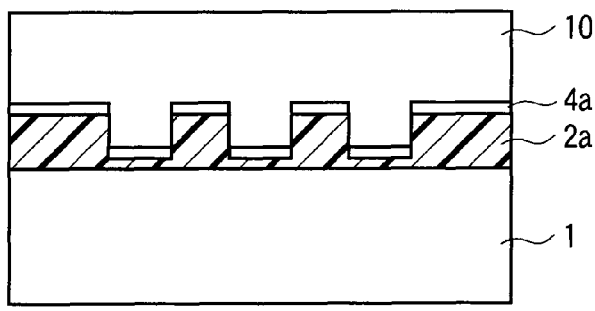
F I G. 20
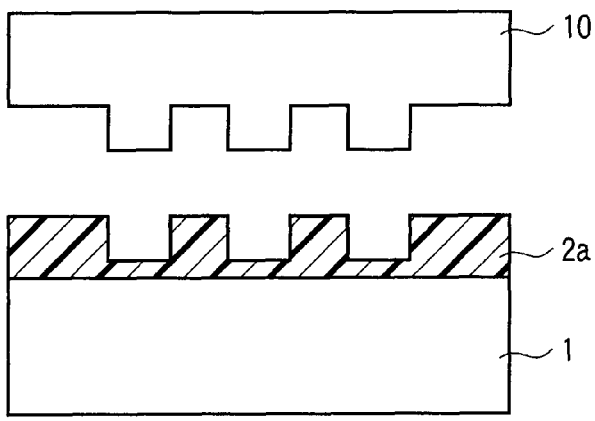
F I G. 21

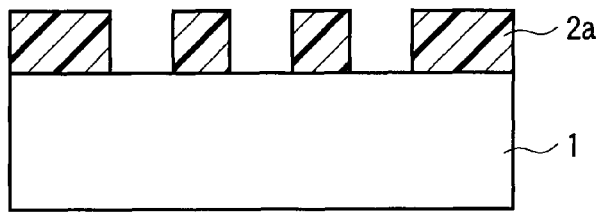
F I G. 22
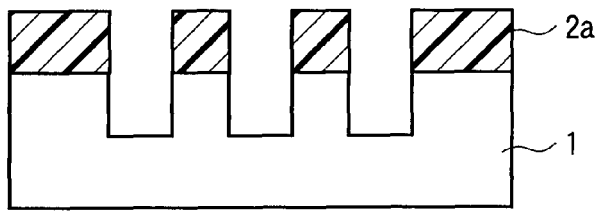
F I G. 23
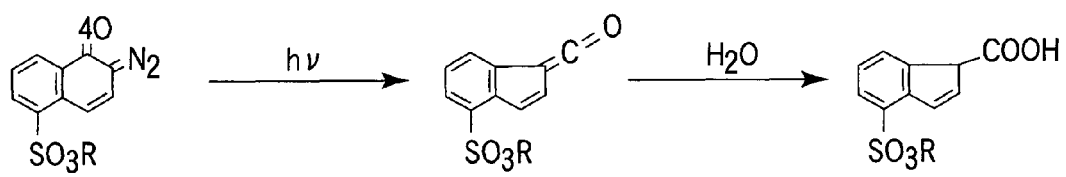
F I G. 24
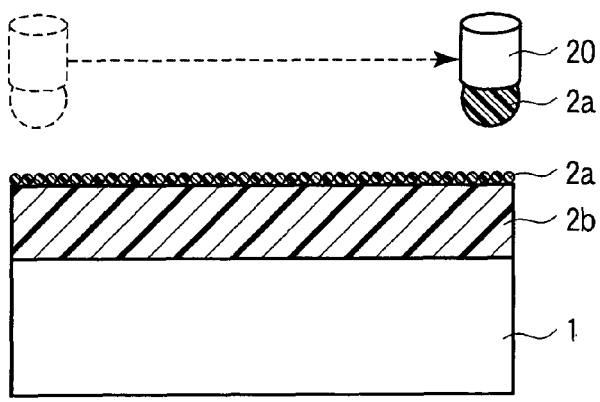
F I G. 25

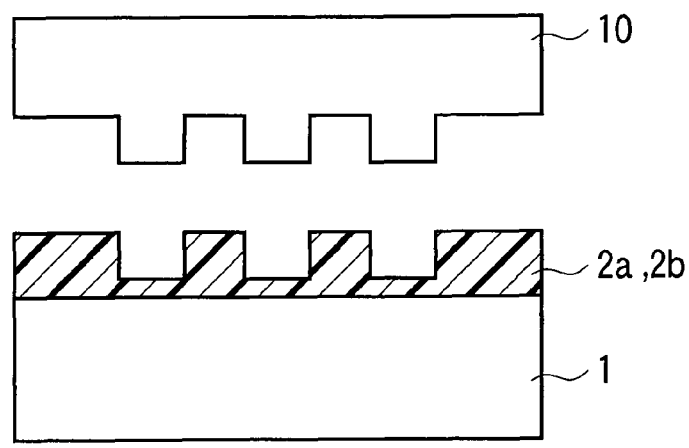
F I G. 29
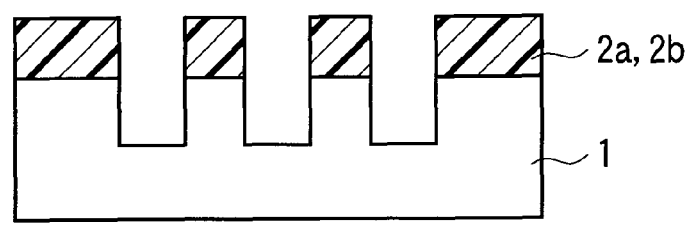
F I G. 30
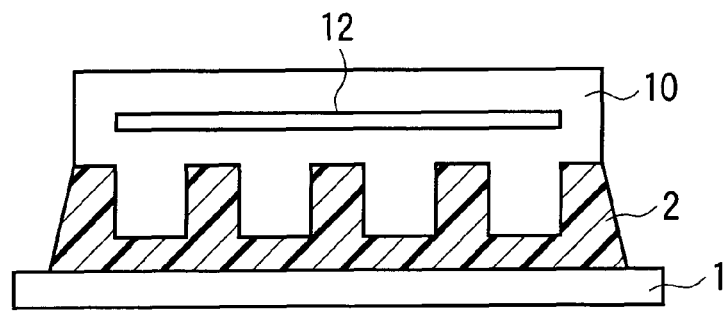
F I G. 31

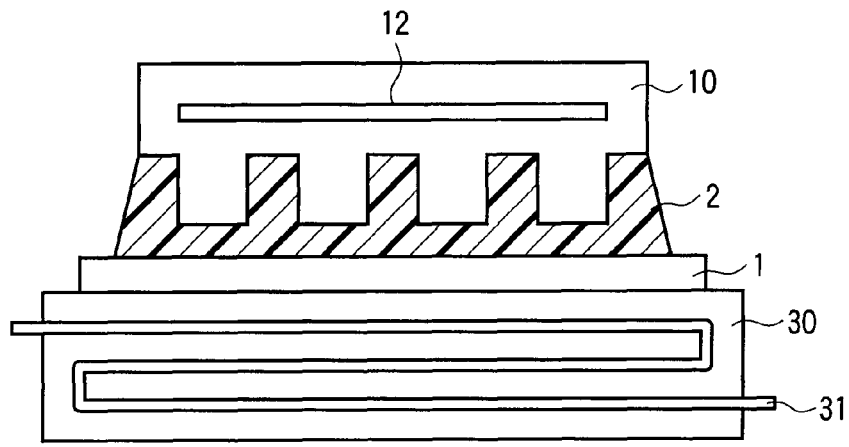
F I G. 32
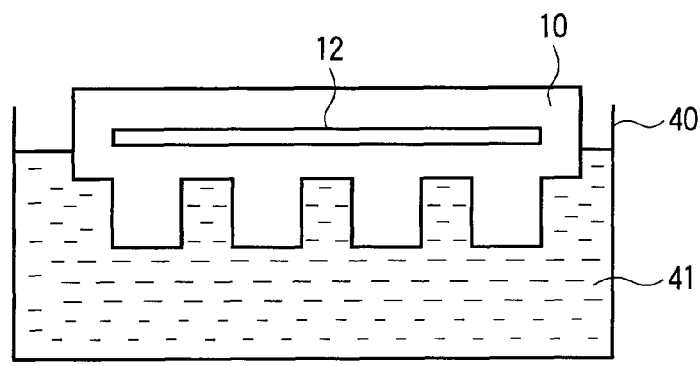
F I G. 33
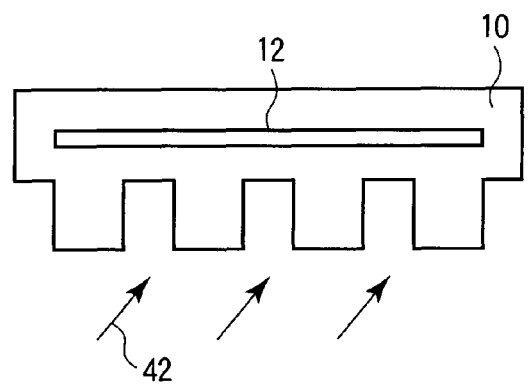
F I G. 34

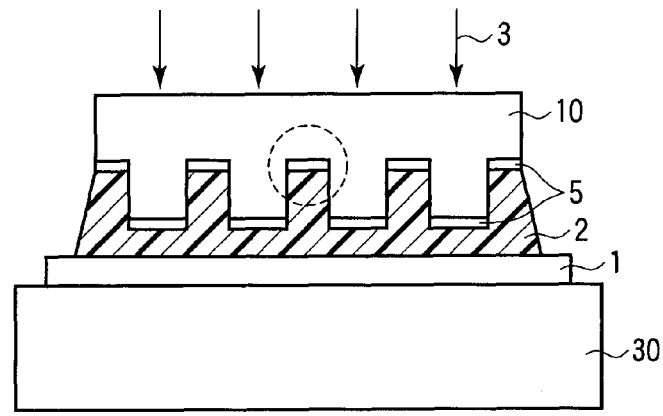
F I G. 35
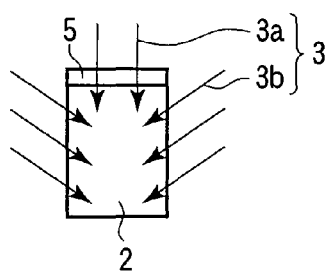
F I G. 36
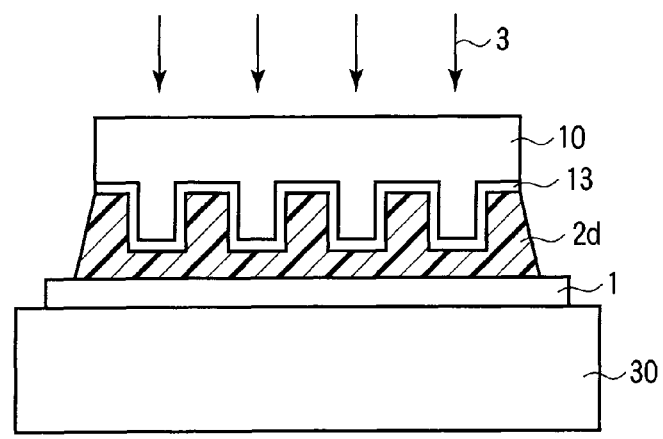
F I G. 37

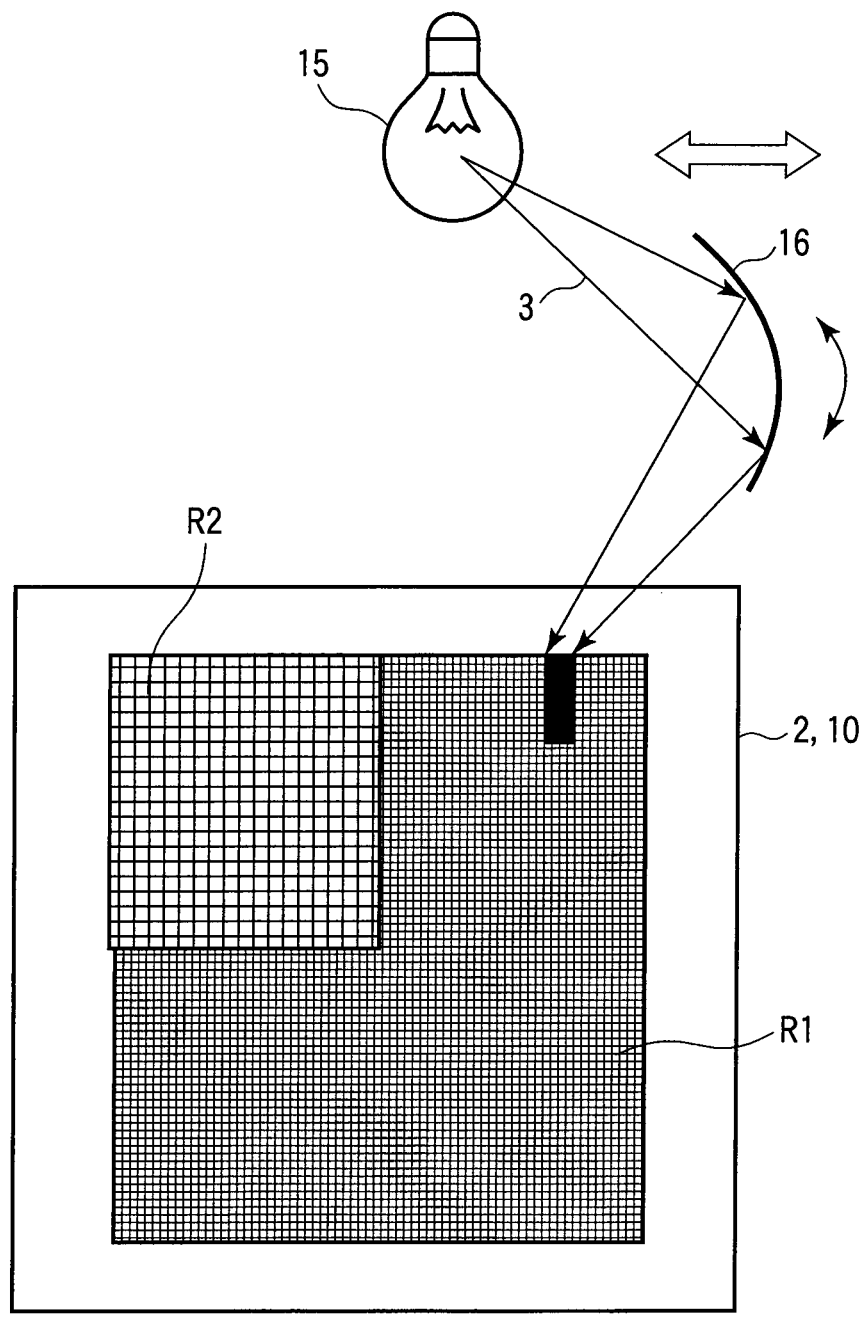
F I G. 40

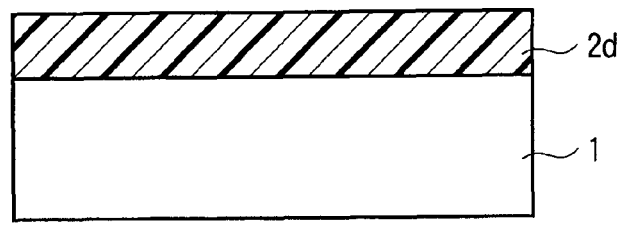
F I G. 41
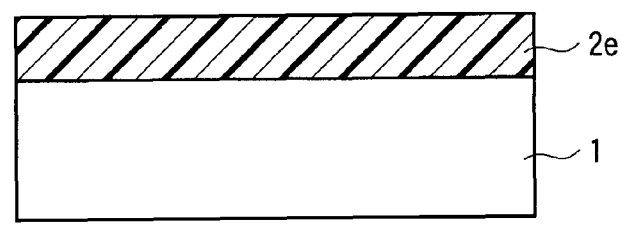
F I G. 42
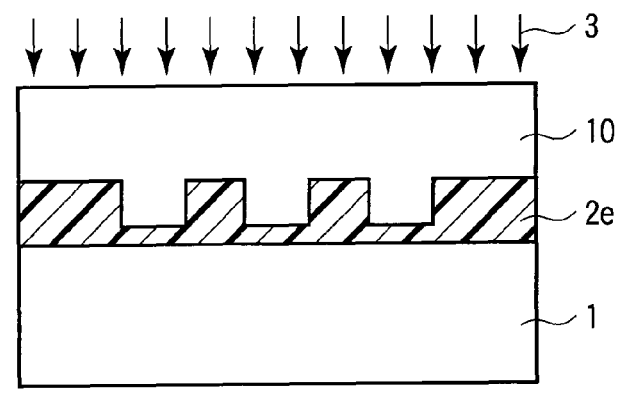
F I G. 43

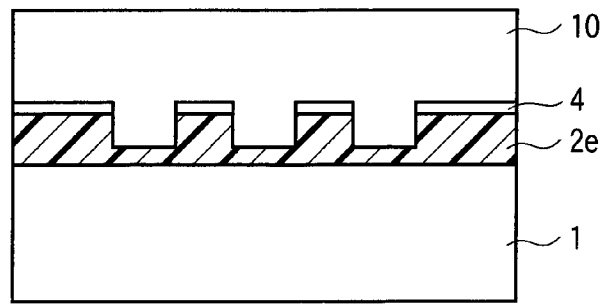
F I G. 44
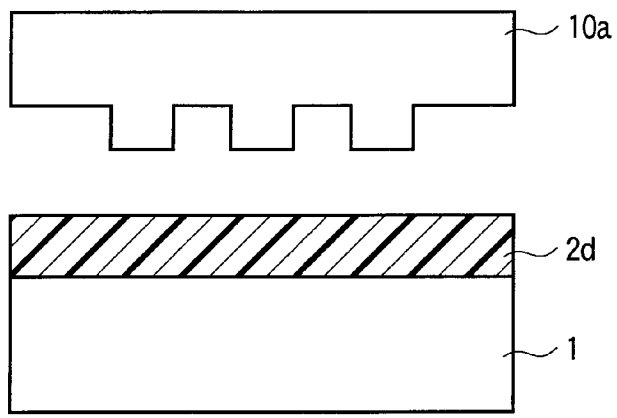
F I G. 45
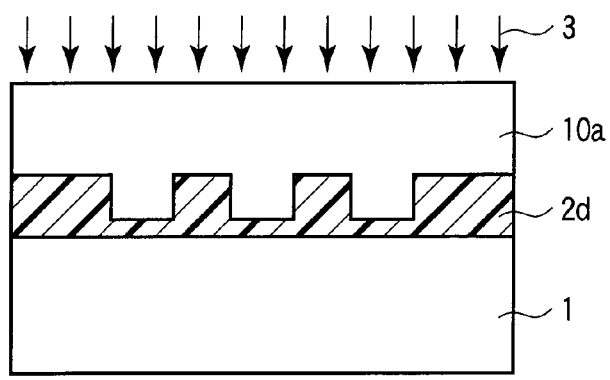
F I G. 46

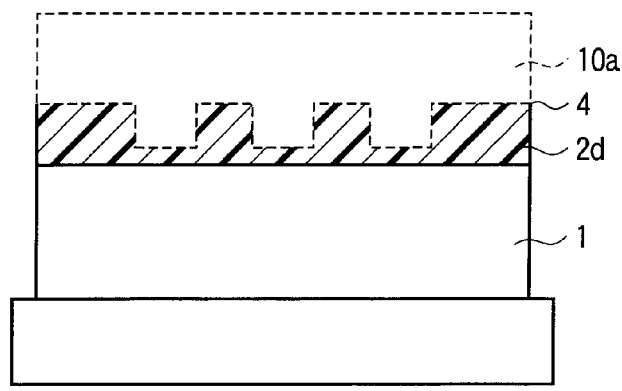
F I G. 47
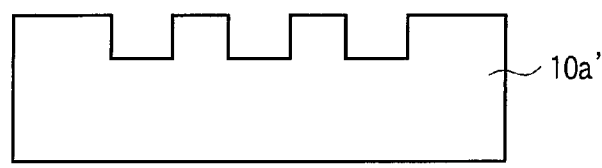
F I G. 48
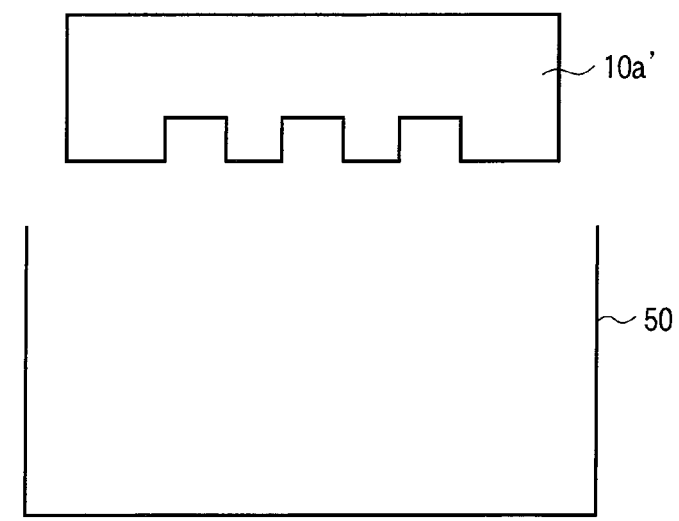
F I G. 49

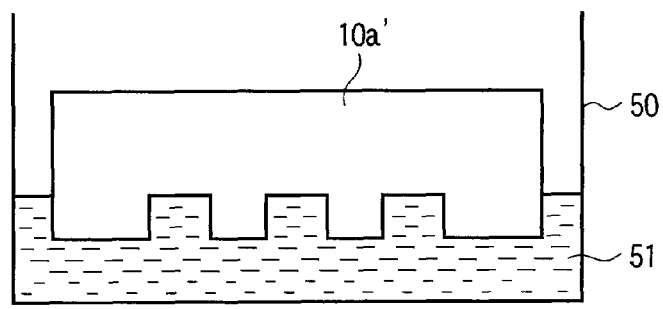
F I G. 50
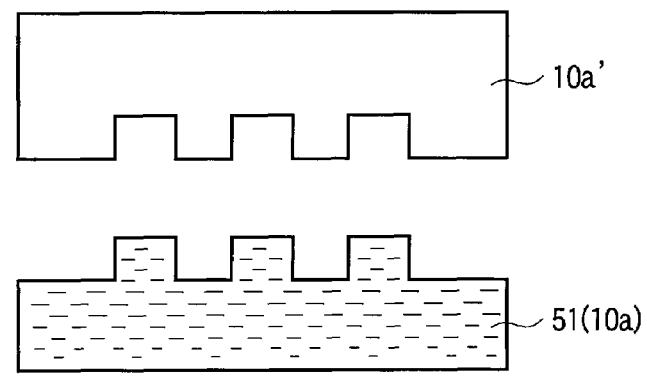
F I G. 51
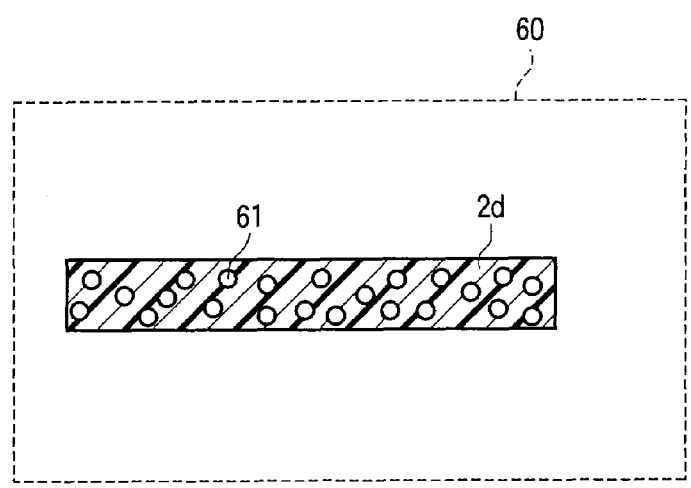
F I G. 52

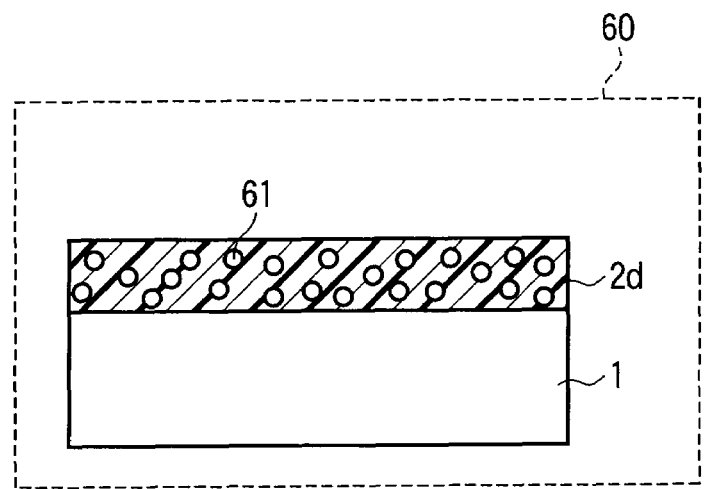
F I G. 53
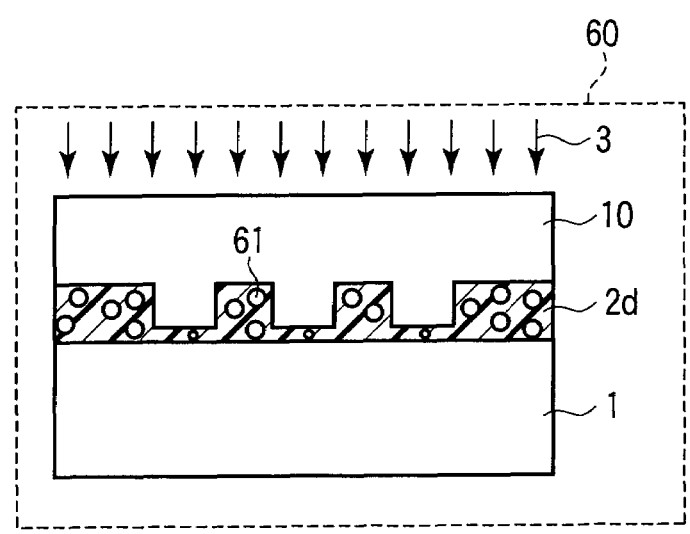
F I G. 54

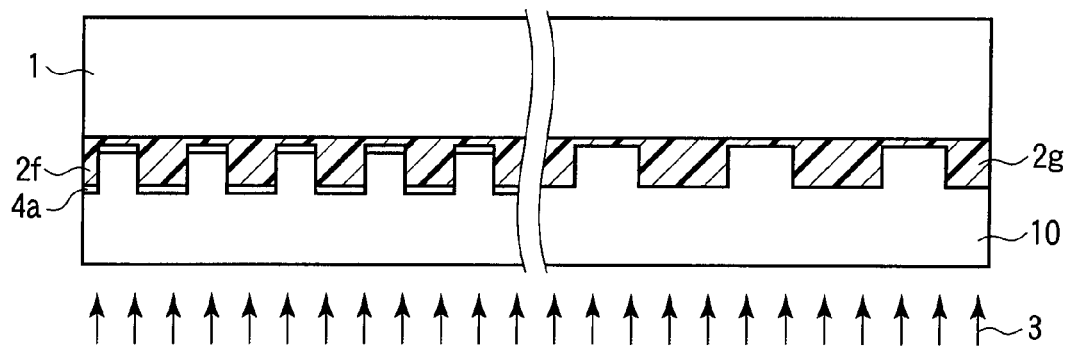
F I G. 58
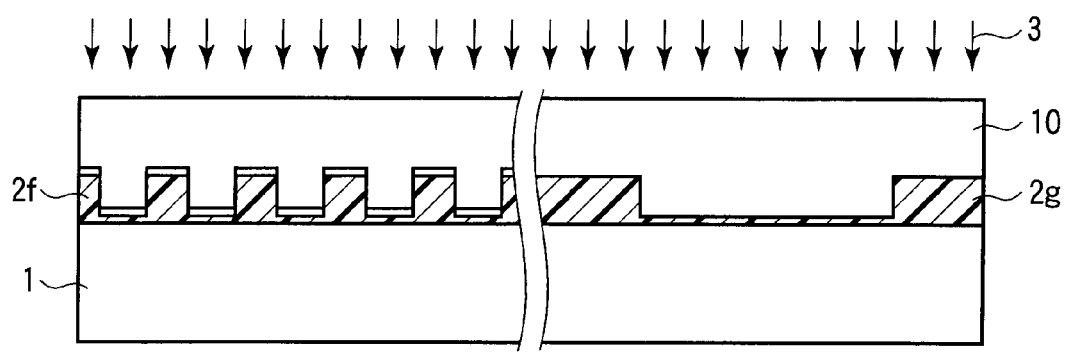
F I G. 59
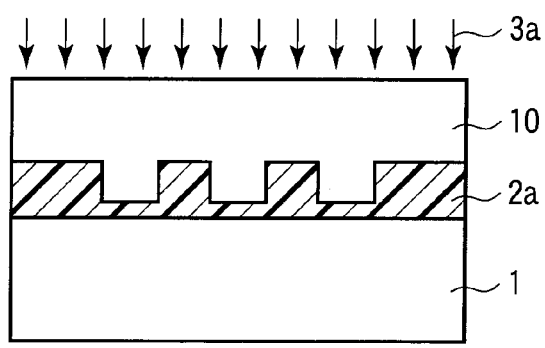
F I G. 60

IMPRINT METHOD

CROSS-REFERENCE TO RELATED APPLICATIONS

This application is based upon and claims the benefit of priority from prior Japanese Patent Applications No. 2008-249167, filed Sep. 26, 2008; and No. 2009-061650, filed Mar. 13, 2009, the entire contents of both of which are incorporated herein by reference.

BACKGROUND OF THE INVENTION

1. Field of the Invention

The present invention relates to an imprint method used for manufacturing a device such as a semiconductor device element, an optical device element or a biological product.

2. Description of the Related Art

As a technique to manage both the formation of fine patterns of less than 100 nm and the mass-productivity in the manufacture of semiconductor device elements, nano-imprint technique has received attention by which a pattern of nano-imprint mold (also known as mold or template) is transferred on a substrate.

An optical (UV) nano-imprint is one of the nano-imprint techniques. The optical nano-imprint includes a step of applying light curable resin on a substrate, a step of aligning the nano-imprint mold with the substrate (alignment), a step of directly contacting the nano-imprint mold on the light curable resin (imprinting), a step of curing the light curable resin by irradiating the light curable resin with light, a step of separating (demolding) the nano-imprint mold from the cured light curable resin (mask) (Jpn. Pat. Appln. KOKAI Publication No. 2000-194142.).

Here, when a narrow and tall pattern, that is, a high aspect ratio of pattern is included in the cured light curable resin, a defect such as tear of the high aspect ration pattern may arise at the time of demolding. One reason for such the defect is that frictional force is generated between the cured light curable resin and the nano-imprint mold at the time demolding, and another reason is that the tensile strength of the cured light curable resin decreases as the pattern width narrows.

BRIEF SUMMARY OF THE INVENTION

According to an aspect of the present invention, there is provided an imprinting method comprising: applying a light curable resin on a substrate to be processed, the substrate including first and second regions on which the light curable resin is applied; contacting an imprint mold with the light curable resin; curing the light curable resin by irradiating the light curable resin with light passing through the imprint mold; generating gas by performing a predetermined process to the light curable resin applied on a region of the substrate, the region including at least the first region, wherein an amount of gas generated from the light curable resin applied on the first region is larger than an amount of gas generated from the light curable resin of the second region; and forming a pattern by separating the imprint mold from the light curable resin after the gas being generated.

BRIEF DESCRIPTION OF THE SEVERAL VIEWS OF THE DRAWING

FIG. 1 is a sectional view showing method for forming a pattern using an imprint method according to a first embodiment;

FIG. 2 is a sectional view showing the method for forming the pattern using the imprint method according to the first embodiment following FIG. 1;

FIG. 3 is a sectional view showing the method for forming the pattern using the imprint method according to the first embodiment following FIG. 2;

FIG. 4 is a sectional view showing the method for forming the pattern using the imprint method according to the first embodiment following FIG. 3;

FIG. 5 is a sectional view showing the method for forming the pattern using the imprint method according to the first embodiment following FIG. 4;

FIG. 6 is a sectional view showing the method for forming the pattern using the imprint method according to the first embodiment following FIG. 5;

FIG. 7 is a sectional view showing the method for forming the pattern using the imprint method according to the first embodiment following FIG. 6;

FIG. 8 is a sectional view showing the method for forming the pattern using the imprint method according to the first embodiment following FIG. 7;

FIG. 9 is a sectional view showing an example of defects that may occur at the time of demolding;

FIG. 10 is a sectional view showing another example of defects that may occur at the time of demolding;

FIG. 11 is a sectional view showing still another example of defects that may occur at the time of demolding;

FIG. 12 is a sectional view showing method for forming a pattern using an imprint method according to a second embodiment;

FIG. 13 is a sectional view showing the method for forming the pattern using the imprint method according to the second embodiment following FIG. 12;

FIG. 14 is a sectional view showing the method for forming the pattern using the imprint method according to the second embodiment following FIG. 13;

FIG. 15 is a sectional view showing the method for forming the pattern using the imprint method according to the second embodiment following FIG. 14;

FIG. 16 is a sectional view showing method for forming a pattern using an imprint method according to a third embodiment;

FIG. 17 is a sectional view showing the method for forming the pattern using the imprint method according to the third embodiment following FIG. 16;

FIG. 18 is a sectional view showing the method for forming the pattern using the imprint method according to the third embodiment following FIG. 17;

FIG. 19 is a sectional view showing the method for forming the pattern using the imprint method according to the third embodiment following FIG. 18;

FIG. 20 is a sectional view showing the method for forming the pattern using the imprint method according to the third embodiment following FIG. 19;

FIG. 21 is a sectional view showing the method for forming the pattern using the imprint method according to the third embodiment following FIG. 20;

FIG. 22 is a sectional view showing the method for forming the pattern using the imprint method according to the third embodiment following FIG. 21;

FIG. 23 is a sectional view showing the method for forming the pattern using the imprint method according to the third embodiment following FIG. 22;

FIG. 24 is a diagram showing how a naphthoquinone diazide compound changes to another substance when the naphthoquinone diazide compound is irradiated with light and releasing nitrogen;

FIG. 25 is a sectional view showing method for forming a pattern using an imprint method according to a fourth embodiment;

FIG. 29 is a sectional view showing the method for forming the pattern using the imprint method according to the fourth embodiment following FIG. 28;

FIG. 30 is a sectional view showing the method for forming the pattern using the imprint method according to the fourth embodiment following FIG. 29;

FIG. 31 is a sectional view showing method for forming a pattern using an imprint method according to a fifth embodiment;

FIG. 32 is a sectional view showing method for forming a pattern using an imprint method according to a sixth embodiment;

FIG. 33 is a sectional view showing a modification of the sixth embodiment;

FIG. 34 is a sectional view showing the method for forming the pattern using the imprint method according to the modification of the sixth embodiment following FIG. 33;

FIG. 35 is a sectional view showing method for forming a pattern using an imprint method according to a seventh embodiment;

FIG. 36 is a magnified view of that region encircled with the broken-line in FIG. 35;

FIG. 37 is a sectional view showing method for forming a pattern using an imprint method according to an eighth embodiment;

FIG. 40 is a plan view showing method for forming a pattern using an imprint method according to a ninth embodiment;

FIG. 41 is a sectional view showing method for forming a pattern using an imprint method according to an eleventh embodiment;

FIG. 42 is a sectional view showing the method for forming the pattern using the imprint method according to the eleventh embodiment following FIG. 41;

FIG. 43 is a sectional view showing the method for forming the pattern using the imprint method according to the eleventh embodiment following FIG. 42;

FIG. 44 is a sectional view showing the method for forming the pattern using the imprint method according to the eleventh embodiment following FIG. 43;

FIG. 45 is a sectional view showing method for forming a pattern using an imprint method according to a twelfth embodiment;

FIG. 46 is a sectional view showing the method for forming the pattern using the imprint method according to the twelfth embodiment following FIG. 45;

FIG. 47 is a sectional view showing the method for forming the pattern using the imprint method according to the twelfth embodiment following FIG. 46;

FIG. 48 is a diagram for explaining a method for forming a mold used in the twelfth embodiment;

FIG. 49 is a diagram for explaining the method for forming the mold used in the twelfth embodiment following FIG. 48;

FIG. 50 is a diagram for explaining the method for forming the mold used in the twelfth embodiment following FIG. 49;

FIG. 51 is a diagram for explaining the method for forming the mold used in the twelfth embodiment following FIG. 50;

FIG. 52 is a sectional view showing method for forming a pattern using an imprint method according to a thirteenth embodiment;

FIG. 53 is a sectional view showing the method for forming the pattern using the imprint method according to the thirteenth embodiment following FIG. 52;

FIG. 54 is a sectional view showing the method for forming the pattern using the imprint method according to the thirteenth embodiment following FIG. 53;

FIG. 58 is a sectional view showing a modification of the fourteenth embodiment;

FIG. 59 is a sectional view showing method for forming a pattern using an imprint method according to a fifteenth embodiment;

FIG. 60 is a sectional view showing method for forming a pattern using an imprint method according to a sixteenth embodiment;

DETAILED DESCRIPTION OF THE INVENTION

Figure 26:
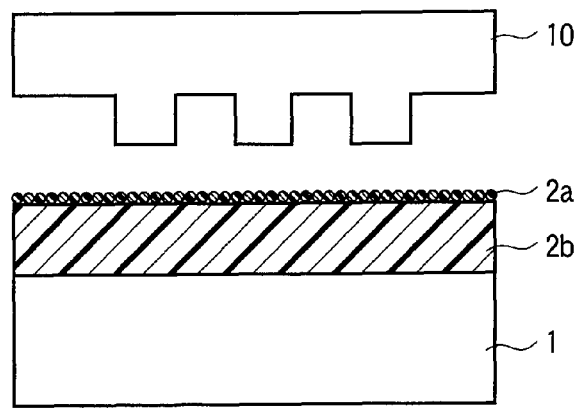
FIG. 26 is a sectional view showing the method for forming the pattern using the imprint method according to the fourth embodiment following FIG. 25.
Figure 27:
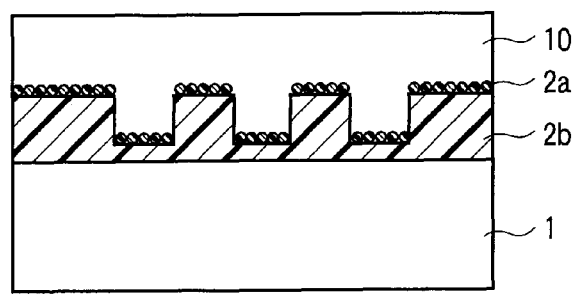
FIG. 27 is a sectional view showing the method for forming the pattern using the imprint method according to the fourth embodiment following FIG. 26.
Figure 28:
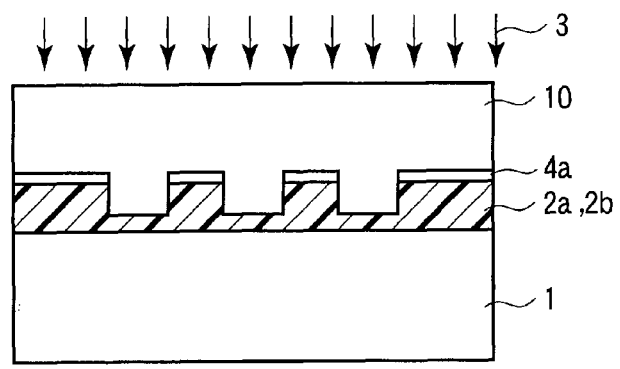
FIG. 28 is a sectional view showing the method for forming the pattern using the imprint method according to the fourth embodiment following FIG. 27.

Hereinafter, the embodiments are described by referring to the drawings.

First Embodiment

FIG. 1 to FIG. 8 are sectional views showing a pattern forming method using an imprint method according to a first embodiment.

[FIG. 1]

A substrate 1 to be processed is coated (applied) with light curable resin 2.

The substrate 1 is, for example, a quartz substrate (transparent substrate), a silicon substrate (semiconductor substrate), or an SOI substrate (semiconductor substrate). Alternatively, the substrate 1 may be a substrate that has multi-layer structure. For example, it may be a multi-layered substrate that is comprised of, for example, such a transparent or semiconductor substrate as mentioned above, and an insulating film or a mask laid on the substrate.

The insulating film is, for example, a multi-layered film comprising a silicon nitride film used as a hard mask and a silicon oxide film laid on the silicon nitride film, or a silicon oxide film or a low-k (low dielectric constant) film, which is used as an interlayer insulating film. The mask is, for example, one that is organic film. Further, a device pattern formed during the device manufacturing process may be provided beneath the lowest layer of the substrate 1.

The light curable resin 2 is cured when it is irradiated with light and generates gas from within. The light curable resin 2, which generates gas (outgas), is made of organic substance having a ESCAP structure, for example.

[FIG. 2]

Alignment between the substrate and an optical imprint mold (hereinafter referred to as mold) 10 is performed. The mold 10 comprises a transparent substrate having a surface on which a pattern (depressions and projections) is formed. The patter includes a high aspect ratio (for example, 3 or more) of pattern. The transparent substrate is, for example, a quartz substrate. The material of the transparent substrate can be changed, as needed, in accordance with the light applied to the substrate. The pattern (depressions and projections) on the surface of the transparent substrate correspond to a pattern (i.e., depressions and projections) that is to be formed on the surface of the substrate 1.

[FIG. 3]

The mold 10 is set in contact with the light curable resin 2 (imprint). At this time, the light curable resin 2 is thinly remained between the projections of the mold 10 and the substrate 1. The thinly remained light curable resin 2 will be a remaining film.

[FIG. 4]

The light curable resin 2 is cured by irradiating the light curable resin 2 with light (not excluding UV to EUV) 3 passing through the mold 10. The UV light have wavelength of, for example, 310 nm.

[FIG. 5]

When the light curable resin 2 is cured by light irradiation, the light curable resin 2 generates outgas, and outgas 4 is accumulated between the light curable resin 2 and the mold 10. In FIG. 5, only the accumulated outgas 4 (outgas layer) existing in the regions where the accumulated outgas readily generates is shown for simplicity. As the outgas 4 tends to expand its volume, the adhesion force between the light curable resin 2 and the mold 10 is weaken. In addition, the entering of external gas into the space caused by outflow of the outgas 4 also weaken the adhesion force between the light curable resin 2 and the mold 10.

[FIG. 6]

The mold 10 is released from the light curable resin 2 (demolding).

At this time, the adhesion force between the light curable resin 2 and the mold 10 is weaken. For this reason, the mold 10 can be released from the light curable resin 2 by force (pull force) smaller than before. Therefore, according to the present embodiment, the occurrence of defect such as tear of pattern having high aspect ratio (pattern tearing) is suppressed.

FIG. 9 to FIG. 11 shows exemplary defects (pattern tearing) that may occur at the time of demolding.

FIG. 9 shows defect resulting from tearing of pattern having high aspect ratio formed in the light curable resin 2.

FIG. 10 shows defect resulting from removal of pattern having high aspect ratio formed in the light curable resin 2 and removal of its surrounding portion.

FIG. 11 shows defect in a case of substrate 1 having a multi-layer structure (FIG. 11 shows an example of two layers 1a and 1b) resulting from removal of pattern having high aspect ratio formed in the light curable resin 2, removal of its surrounding portion and further removal of its underlying portion 1b. The removal of underlying portion 1b is caused by tearing at an interface between two layers having lowest adhesion force when the layers of multi-layer structure of substrate 1 have weak adhesiveness for each of the neighboring layers

[FIG. 7]

The remained light curable resin 2 (residual film) is removed, and a mask made of the cured light curable resin (light curable resin mask) 2 is obtained. The removal of residual film is performed, for example, by using anisotropic etching mainly employing oxygen plasma.

[FIG. 8]

By using the light curable resin mask 2 as an etching mask, the substrate 1 is etched, and a fine pattern is formed on the substrate 1. Thereafter, the light curable resin mask 2 is removed. According to the present embodiment, since the occurrence of defect (pattern tearing) at the time of demolding is suppressed, a high-quality fine pattern free from the defect is formed. This can enhance the yield of the product.

Here, when the substrate 1 is a transparent substrate or a semiconductor substrate, the transparent substrate or the semiconductor substrate is etched. On the other hand, when the substrate is a multi-layer structure comprising, for example, transparent substrate/insulting film, or semiconductor substrate/insulating film, the insulating film is etched. Thereby, an insulating film (hard mark) to which the pattern of light curable resin mask 2 is transferred. Thereafter, by using this hard mask as an etching mask, the transparent substrate or the semiconductor substrate is etched, and a fine pattern is formed.

In the present embodiment, cross-sectional shape of a projection portion of mold 10 is rectangular, but the shape may be changed in accordance with a pattern of device to be formed (device pattern). For example, in a case of a micro-lens array used for CCD, side surface of projection of mold 10 includes a circular arc shape.

The pattern forming method of the present embodiment can be applied not only to the micro-lens arrays (optical element), but also to semiconductor devices (e.g., MOS transistors constituting CMOS logic) or a pattern formed on Si wafer constituting a DNA chip (biotec product) (the same goes for any other embodiment).

The adhesion force between the light curable resin 2 and the mold 10 may be evaluated after the step of FIG. 5 is performed (the same goes for any other embodiment). That is, after the step of FIG. 5, the determination whether the adhesion force between the light curable resin 2 and the mold 10 is equal to or less than a predetermined value (threshold value) may be performed (evaluation step). The predetermined value (threshold value) is set on a value such that the defect (pattern tearing) does not occur at the time of demolding.

To be more specific, the light curable resin 2 is irradiated with light from the mold 10 side, and the amount of outgas 4 is estimated from the intensity of the light reflected from the light curable resin 2. If the estimated amount of the outgas 4 is equal to or larger than a predetermined value, the adhesion force is determined to have equal to or less than the predetermined value, then the step of FIG. 6 (demolding) is performed. If the estimated amount of the outgas 4 is less than the predetermined value, the light curable resin 2 is further irradiated with the light 3 (re-irradiation) to generate more outgas 4.

As the another determining method, it is proposed to pull the mold 10 at the step of FIG. 8 (demolding) by force smaller than the predetermined force to separated the mold 10 from the light curable resin 2, and if the mold 10 is not separated from the light curable resin 2 at all, the adhesion force is determined not to be reduced, then the light curable resin 2 is further irradiated with the light 3 to generate more outgas 4.

Second Embodiment

FIG. 12 to FIG. 15 are sectional views showing method for forming a pattern using an imprint method according to a second embodiment. In the following figures, the portions corresponding to the portions shown in the previously mentioned drawings are denoted by the same reference numerals and omitted its detail explanation.

[FIG. 12]

A substrate 1 to be processed is coated with light curable resin 2.

If the light curable resin 2 is cured with light, while held in contact with a photocatalyst layer, it will generate more outgas than in the case it contacts no photocatalyst layer. In order to generate outgas effectively according to the above manner, the light curable resin 2 is for example formed of organic substance having SCAP structure, and a titanium oxide layer is used as the photocatalyst layer for instance.

The substrate 1 is aligned with the mold 10 (alignment step).

The pattern surface (projections and depressions pattern) of the mold 10 is covered with a photocatalyst layer 11. The photocatalyst layer 11 is, for example, a titanium oxide layer, as pointed out above. The process for forming the titanium oxide layer includes a step of depositing a titanium layer on the pattern surface of the mold 10 and a step of oxidizing the titanium layer.

The titanium oxide layer can be formed, not by separating the step of depositing the titanium layer and the step of oxidizing the titanium layer. For example, in a case of using spattering method, the $TiO_2$ layer is formed by using a target made of Ti and introducing a small amount of oxygen gas into a vacuum chamber. In addition, in a case of using EB vapor deposition method, the $TiO_2$ layer is formed by using a target comprising crystal powder of $TiO_2$ formed by calcination and harden into a tablet shape.

[FIG. 13]

The mold 10 is contacted with the light curable resin 2 (imprint).

The light curable resin 2 is cured by irradiating the light curable resin 2 with light 3.

[FIG. 14]

When the light curable resin 2 is irradiated with light in a state that the light curable resin 2 is contacted with the photocatalyst layer 11, the light curable resin 2 generates outgas 4, thus after the light irradiation, the outgas 4 is accumulated between the light curable resin 2 and the photocatalyst layer 11. As the outgas 4 tends to expand its volume, the adhesion force between the light curable resin 2 and the mold 10 is weaken.

[FIG. 15]

The mold 10 is released from the light curable resin 2 (demolding).

At this time, the adhesion force between the light curable resin 2 and the mold 10 is weaken by outgas. For this reason, the mold 10 can be released from the light curable resin 2 by force (pull force) smaller than before. Therefore, according to the present embodiment, the occurrence of defect such as tear of pattern having high aspect ratio (pattern tearing) is suppressed.

Thereafter, as in the first embodiment, the step of FIG. 7 (removal of residual film), the step of FIG. 8 (etching of substrate to be processed) and so on are performed.

As in the first embodiment, the present embodiment can suppress the occurrence of defect (pattern tearing) at the time of demolding, the high-quality fine pattern free from the defect is formed, and consequently the yield of the product is enhanced.

In the present embodiment, the mold 10 having formed the photocatalyst layer 11 thereon is used, a method of forming the photocatalyst layer 11 on the light curable resin 2 instead of on the mold 10 also provide the same effect as the present embodiment. Moreover, the photocatalyst layers 11 may be formed on both the light curable resin 2 and the mold 10, respectively.

Third Embodiment

FIG. 16 to FIG. 23 are sectional views showing method for forming a pattern using an imprint method according to a third embodiment.

[FIG. 16]

A substrate 1 to be processed is coated with light curable resin 2a.

The light curable resin 2a contains a naphthoquinone diazide compound. More precisely, the light curable resin 2a is made by dissolving a compound of benzophenone and naphthoquinone diazide bonded to the benzophenone (naphthoquinone diazide compound) into solvent. It is desirable to coat (drip) imprint material containing the naphthoquinone diazide compound onto the substrate 1 such that the naphthoquinone diazide compound may locally exist in a surface layer of the light curable resin 2a.

As shown in FIG. 24, the naphthoquinone diazide compound changes to indenecarbonic acid when the naphthoquinone diazide compound is irradiated with light (hυ). When the naphthoquinone diazide compound changes into the indenecarbonic acid, the naphthoquinone diazide compound generates nitrogen gas. Therefore, the light curable resin 2a generates outgas (nitrogen gas) when it is cured by light irradiation.

[FIG. 17]

The substrate 1 is aligned with a mold 10.

[FIG. 18]

The mold 10 is contacted with the light curable resin 2a (imprint).

[FIG. 19]

The light curable resin 2a is cured by irradiating the light curable resin 2a with light 3.

[FIG. 20]

When the light curable resin 2a is irradiated with light, the light curable resin 2a generates outgas (nitrogen gas), thus after the light irradiation, the outgas (nitrogen gas) 4a is accumulated between the light curable resin 2a and the mold 10. As the outgas 4a tends to expand its volume, the adhesion force between the light curable resin 2a and the mold 10 is weaken. To generate the outgas 4a efficiently, it is desired that the light 3 should have a wavelength ranging from 300 to 450 nm.

[FIG. 21]

The mold 10 is released from the light curable resin 2a (demolding).

At this time, the adhesion force between the light curable resin 2a and the mold 10 is weaken by outgas 4a. For this reason, the mold 10 can be released from the light curable resin 2a by force (pull force) smaller than before. Therefore, according to the present embodiment, the occurrence of defect such as tear of pattern having high aspect ratio (pattern tearing) is suppressed.

Here, when the light curable resin 2a contains 5 mol % of naphthoquinone diazide compound, the assist force by the outgas (nitrogen gas) at the time of demolding is about 150 N, accordingly the occurrence of defect (pattern tearing) is effectively suppressed. It would be noted that the effect of suppressing the defect is obtained when the naphthoquinone diazide compound contains equal to less than 0.1 mol % of naphthoquinone diazide compound.

[FIG. 22]

The remained light curable resin 2a (residual film) is removed, and a mask made of the cured light curable resin (light curable resin mask) 2a is obtained.

[FIG. 23]

By using the light curable resin mask 2a as an etching mask, the substrate 1 is etched, and a fine pattern is formed on the substrate 1. Thereafter, the light curable resin mask 2a is removed.

According to the present embodiment, since the occurrence of defect (pattern tearing) at the time of demolding is suppressed, the high-quality fine pattern free from the defect is formed. This can enhance the yield of the product.

In the present embodiment, the light curable resin 2a is used in all regions, but the light curable resin 2a may be used in specified region only, and an ordinary light curable resin which does not generate outgas maybe used in the remaining regions.

The specified region is, for example, a region needed large mold-releasing force, more precisely, the region including a high density of pattern (high density pattern region). Since the high density of pattern has a large surface area, it needs large mold-releasing force. Note that the mold-releasing force is force needed for releasing the mold from the light curable resin cured by light irradiation in the step of demolding.

By using the light curable resin 2a only on the region needed the large mold-releasing force as above stated, variation of the large mold-releasing force in a pattern plane of the mold 10 is reduced, and distortion of the mold at the time of demolding is reduced, thereby the occurrence of defects at the time of demolding is suppressed. The same effect is confirmed even by using a mold in which $N_2$ is generated by selectively exposing a dense pattern portion of the mold after processing whole pattern surface of the mold by solution containing DNQ.

Fourth Embodiment

FIG. 25 to FIG. 30 are sectional views showing method for forming a pattern using an imprint method according to a fourth embodiment.

A substrate 1 to be processed is coated with light curable resin 2b that contains no naphthoquinone diazide compound.

The light curable resin layer 2b is coated with a light curable resin 2c that contains naphthoquinone diazide compound. By using a scan nozzle 20, imprint material containing naphthoquinone diazide compound is dripped onto the light curable resin 2b, thus the light curable resin layer 2c is applied.

[FIG. 26]

The substrate 1 is aligned with the mold 10.

[FIG. 27]

The mold 10 is contacted with the light curable resins 2b and 2c (imprint).

[FIG. 28]

The light curable resins 2b and 2c are cured by irradiating the light curable resin 2b and 2c with light 3.

When the light curable resin 2c is irradiated with light, the light curable resin 2c generates outgas (nitrogen gas), thus after the light irradiation, the outgas (nitrogen gas) 4a is accumulated between the light curable resins 2b and 2c and the mold 10. As the outgas 4a tends to expand its volume, the adhesion force between the light curable resins 2b and 2c and the mold 10 is weaken.

[FIG. 29]

The mold 10 is released from the light curable resins 2b and 2c (demolding).

At this time, the adhesion force between the light curable resins 2b and 2c and the mold 10 is weaken by outgas 4a. For this reason, the mold 10 can be released from the light curable resins 2b and 2c by force (pull force) smaller than before. Therefore, according to the present embodiment, the occurrence of defect such as tear of pattern having high aspect ratio (pattern tearing) is suppressed.

Here, when the light curable resin 2c contains 5 mol % of naphthoquinone diazide compound, the assist force by the outgas (nitrogen gas) at the time of demolding is about 150 N, accordingly the occurrence of defect (pattern tearing) is effectively suppressed.

[FIG. 30]

The remained light curable resins 2b and 2c (residual film) are removed, and a mask made of the cured light curable resins (light curable resin mask) 2b and 2c is obtained.

By using the light curable resin mask 2b and 2c as an etching mask, the substrate 1 is etched, and a fine pattern is formed on the substrate 1. Thereafter, the light curable resin mask 2b and 2c is removed.

As in the third embodiment, the present embodiment can suppress the occurrence of defect (pattern tearing) at the time of demolding, the high-quality fine pattern free from the defect is formed. Thereby, the yield of the product is enhanced.

Fifth Embodiment

FIG. 31 is a sectional view showing method for forming a pattern using an imprint method according to a fifth embodiment.

The present embodiment is different from the first to fourth embodiments in that a mold 10 including a heat generating member 12 which generates heat is used. The light curable resin 2 is heated directly or indirectly at the time of demolding by the heat generating member 12. The light curable resin 2 is indirectly heated when the mold 10 or the substrate 1 is heated by the heat generating member 12, and temperature of the mold 10 or substrate 1 rises, and consequently the light curable resin 2 is heated.

The heat generating member 12 is, for example, an infrared ray absorbing body that absorbs infrared ray. As the material of infrared ray absorbing body, Carbon (black lead) is named for instance. The infrared ray absorbing body which absorbed the infrared ray generates heat (radiation heat). Note that the light for curing the light curable resin 2 passes through the infrared ray absorbing body. The infrared ray absorbing body is irradiated with the infrared rays by an infrared ray source not shown at the time of demolding. The heat generating member 12 may be a resistance heater.

According to the present embodiment, solvent remaining in the light curable resin 2, for example propyleneglycol monomethyl ether acetate (PGMEA) is vaporized by heat generated from the heat generating member 12. As a result, outgas is accumulated between the light curable resin 2 and the mold 10. The outgas weakens the adhesion force between the light curable resin 2 and the mold 10, and hence the occurrence of defect at the time of demolding (demolding defect) is suppressed as the first embodiment. Since the outgas is generated from a surface of the light curable resin 2 in which the surface is in contact with the mold 10, occurrence of defect (void) is suppressed, in which the defect (void) is caused by gas generated in the light curable resin 2 and remained therein.

When the infrared ray absorbing body is used as the heat generating member 12, the light curable resin 2 can be uniformly heated by increasing area of the infrared ray absorbing body (facing area of the infrared ray absorbing body to the light curable resin 2) Thereby, the outgas can be uniformly generated, and the defect is further reduced.

Sixth Embodiment

FIG. 32 is a sectional view showing method for forming a pattern using an imprint method according to a sixth embodiment.

The present embodiment differs from the fifth embodiment in that a chuck 30 comprising a mechanism configured to lower temperature by cooling medium is used. Here, the explanation is given in a case that the mechanism uses a pipe 31 in which the cooling medium flows. The cooling medium is, for example, alternatives for chlorofluorocarbon, and is supplied into the pipe 31 from a cooling medium supplying apparatus not shown.

The coating step of the light curable resin 2 to the curing step of the light curable resin 2 by light irradiation is performed. Then, the cooling medium is introduced into the pipe 31 to cool the pipe 31, thereby thermal expansions of the substrate 1, light curable resin 2 and mold 10 are suppressed. Thereafter, the demolding is performed. This gives suppression of demolding defect without causing loss of alignment precision which may be arisen by heat generated by the heat generating member 12.

Prior to the next shot (imprint), as is illustrated in FIG. 33, the mold 10 may be immersed in liquid 41 as the cooling medium contained in a vessel 40, thereafter, the mold 10 is pulled out of the liquid 41, and as shown in FIG. 34, the mold 10 may be dried by air. Thereby the loss of alignment precision due to the expansion of the mold 10 is more effectively suppressed.

Seventh Embodiment

FIG. 37 is a sectional view showing method for forming a pattern using an imprint method according to a seventh embodiment.

The present embodiment differs from the first embodiment in that a semitransparent film 5 is provided on the projections and depressions of the mold 10. The semitransparent film 5 has a transmittance of 5% to the light of 365 nm wavelength (light (UV light) for curing the light curable resin 2) for instance.

FIG. 36 is a magnified view of that region encircled with the broken-line in FIG. 35.

The light 3 includes light 3a which irradiates a top surface of the semitransparent film 5 (light of vertical component) and light 3b which does not irradiates the semitransparent film 5 (light of oblique component). As the light 3a reduces its intensity by passing through the semitransparent film 5, the light curable resin 2 beneath the semitransparent film 5 is not sufficiently cured. Here, irradiation dose of the light 3 is set such that the light curable resin 2 beneath the semitransparent film 5 is not cured. On the other hand, as the light 3b does not pass through the semitransparent film 5, the portion of light curable resin 2 where the light 3b is irradiated with is sufficiently cured.

Therefore, the adhesion force between the mold 10 and the light curable resin 2 facing via the semitransparent film is weaken, and the occurrence of defects at the time of demolding is suppressed.

Here, if the light curable resin 2 is heated by infrared rays as mentioned in the fifth embodiment, the gas is generated from the uncured light curable resin 2 beneath the semitransparent film 5, and the occurrence of defect at the time of demolding is more effectively suppressed.

In the present embodiment, the semitransparent film 5 is provided on the projections and depressions of the mold 10, but the film 5 may be provided on only the projections or the depressions. Further, in place of the semitransparent film 5, a light shielding film may be used, which shields the light for curing the light curable resin 2.

Eighth Embodiment

FIG. 37 is a sectional view showing method for forming a pattern using an imprint method according to an eighth embodiment.

The present embodiment differs from the first to seventh embodiments in that the pattern surface of the mold 10 is coated with a coating film 13 that can generate gas. The material of coating film 13 is, for example, a material that absorbs gas in normal state (not irradiated with light) and generates gas when irradiated with the light. Here, a light curable resin 2d is used, which does not generate gas by the irradiation of light 3.

When the pattern surface is coated with the coating film 13 formed of such the material, the gas existing in an atmosphere surrounding the mold 10 is absorbed on a surface of the coating film 13 until the step of contacting the mold 10 with the light curable resin 2 (imprint).

When the light curable resin 2d is cured by light irradiation which is performed after the imprint, the gas is desorbed from the surface of the coating film 13 since the coating film is irradiated with the light. The desorbed gas acts as outgas, the adhesion force between the light curable resin 2d and the mold 10 is weaken. Therefore, the occurrence of demolding defect is suppressed.

In the present embodiment, the gas is desorbed from the surface of the coating film 13 by the irradiation of light 3 for curing the light curable resin 2d, but another coating film from which the gas is not desorbed by the irradiation of light 3 for curing the light curable resin 2d, but the gas is desorbed by irradiation of light (light for desorbing gas) having different wavelength from the light 3 may be used.

If such the coating film is used, the degassing by irradiation of the light for desorbing gas can be performed after the curing of the light curable resin 2d by the irradiation of the light 3. At this time, by setting irradiation time of the light for desorbing gas longer than irradiation time of the light 3, more gas can be generated. Therefore, the occurrence of defect at the time of demolding is more effectively suppressed.

In the present embodiment, the entire pattern surface of the mold 10 is coated with the coating film 13, but a part of the pattern surface may be coated with the coating film 13. Moreover, the light curable resin 2 that generates gas when irradiated with light may be used.

Ninth Embodiment

Figure 38:
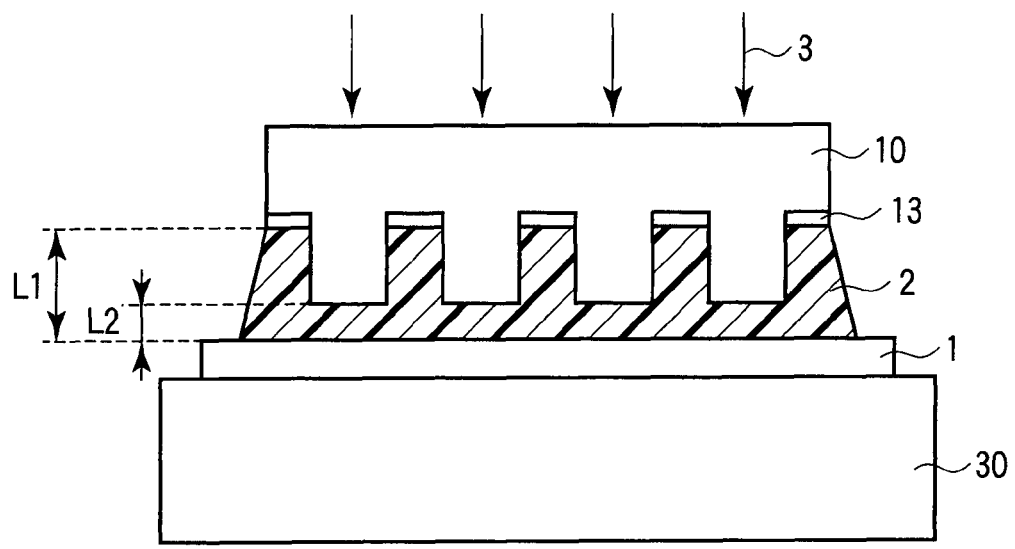
FIG. 38 is a sectional view showing method for forming a pattern using an imprint method according to a ninth embodiment.
Figure 39:
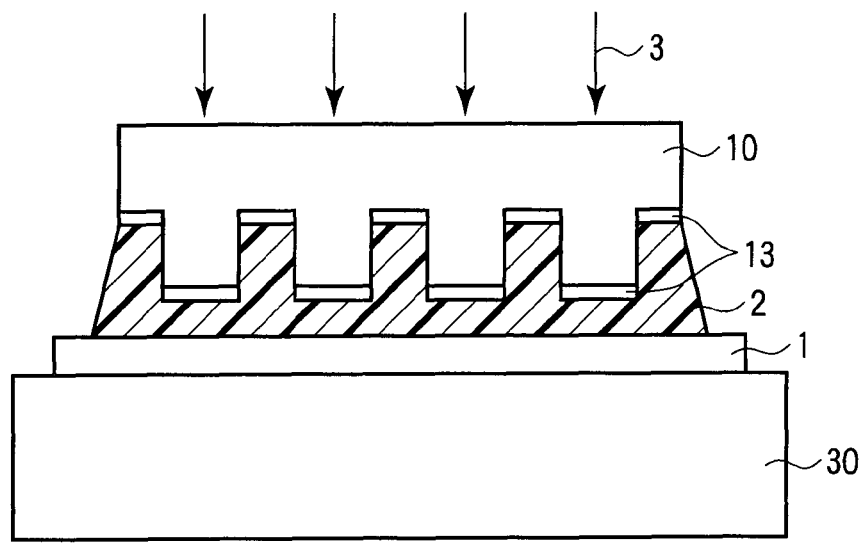
FIG. 39 is a sectional view showing a modification of the ninth embodiment.
Figure 55:
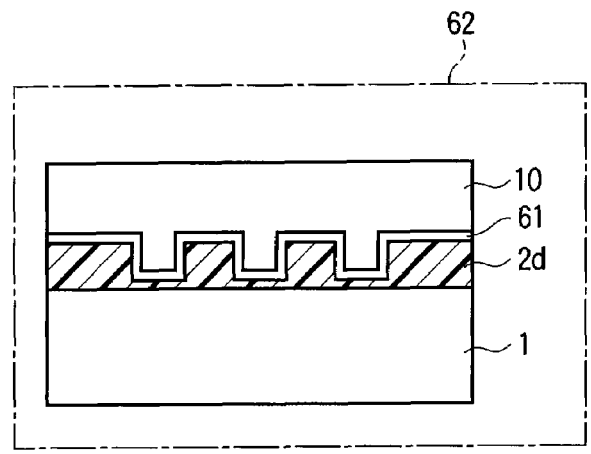
FIG. 55 is a sectional view showing the method for forming the pattern using the imprint method according to the thirteenth embodiment following FIG. 54.

FIG. 38 is a sectional view showing method for forming a pattern using an imprint method according to a ninth embodiment.

The present embodiment differs from the first to eighth embodiments in that a phase/transmittance adjusting film 14 is provided in the depressions of the mold 10. The phase/transmittance adjusting film 14 adjusts at least one of the phase of light 3 and the transmittance of light 3. The material of the phase/transmittance adjusting film 14 is, for example, MoSi, SiN, Cr or CrO.

A peak of standing wave of light 3 can be generated at a vicinity of interface between the depressions of the mold 10 and the light curable resin 2 by designing the phase/transmittance adjusting film 14 considering the optical parameters of the phase/transmittance adjusting film 14 (e.g., refractive index and attenuation coefficient k), the distance L1 from the substrate 1 to the depressions of the mold 10, the distance L2 from the substrate 1 to the projections of the mold 10, the wavelength of light 3 (curing wavelength), the refractive index of the mold 10, and the like. For example, if the curing wavelength is 310 nm, the refractive index of the mold 10 is 1.5 (refractive index of quartz) and the refractive index of the light curable resin 2 is 1.45, the standing wave of light 3 can have the peak near the interface.

By generating the peak of standing wave of the light 3 near the interface between the light curable resin 2 and the depressions of the mold 10, the amount of generated outgas near the interface between the light curable resin 2 and the depressions of the mold 10 is increased. Therefore, the occurrence of defect at the time of demolding is effectively suppressed.

In the present embodiment, the phase/transmittance adjusting film 14 is provided in the depressions of the mold 10, but the phase/transmittance adjusting film 14 may be provided in the depressions of the mold 10 and on the projections of the mold 10. Thereby, the occurrence of defect at the time of demolding is more effectively suppressed.

Tenth Embodiment

FIG. 40 is a sectional view showing method for forming a pattern using an imprint method according to a tenth embodiment.

In the present embodiment, after a light irradiation (first light irradiation) for curing the light curable resin 2 (first light curable resin), a light irradiation (second light irradiation) for generating outgas is applied only to a region R1 (first region) where the mold-releasing force is large. Therefore, after the second light irradiation, the mold-releasing force on the first region R1 is decreased.

The first region R1 is a region where the fine pattern is formed, a region where the high density pattern is formed, or a region including the above two region. In FIG. 40, R2 indicates the second region where the mold-releasing force is small. The second region R2 is a region where the larger pattern is formed than the first region R1, or a region where the low density pattern is formed. After the second light irradiation, the difference of mold-releasing force between the first and second regions R1 and R2 becomes smaller.

Both the first and the second light irradiations are performed by using UV light having wavelength of 310 nm. That is, light of the same wavelength is used in the first and the second light irradiation. However, the first light irradiation is performed in such conditions that the light curable resin 2 is cured, but outgas is not generated.

For example, the irradiation dose of the light curable resin 2 per unit area in the first region R1 is set higher than the irradiation dose of the light curable resin 2 per unit area in the second region R2. To accomplish this, the scan speed in the first region R1 is set slower than the scan speed in the second region R2.

If the demolding is performed after the second light irradiation, the difference of mold-releasing force between the first and second regions R1 and R2 is decreased, and distortion of the mold 10 at the time of demolding is reduced. Thereby, the occurrence of demolding defect is suppressed.

In the present embodiment, the light irradiation is performed in such conditions that outgas is generated from the light curable resin 2 coated on the first region R1, but the light irradiation may be performed in such conditions that outgas is further generated from the light curable resin 2 coated on the second region R2. The condition is, for example, the irradiation dose larger than a predetermined value. In addition, as long as the occurrence of demolding defect is suppressed, the magnitude relation between the amount of gas generated in the first region R1 (Q1) and the amount of gas generated in the second region R2 (Q2) is not limited in particular (Q1>Q2, Q1=Q2, or Q1<Q2). The relation may be Q1>Q2 in most cases.

Even the gas generating step using such the light curable resin is performed, the mold is released from the each region by mold-releasing force equal to or less than a certain level, and the occurrence of demolding defect is suppressed.

In this case, a gas generating step in which the light curable resin on the first and second regions R1 and R2 are respectively heated by different irradiation dose and different heat quantity, or a gas generating step in which the light curable resin on the first and second regions R1 and R2 are respectively pressed by different pressure and different irradiation dose.

The light curable resin used at this time is a light curable resin in which the amount of generated outgas changes in accordance with the irradiation dose of light, or a light curable resin in which the amount of generated outgas is constant (does not change) regardless of the irradiation dose of light. When the light curable resin in which the amount of generated outgas changes in accordance with the irradiation dose of light is used, the amount of outgas can be changed by a plurality of parameters (irradiation dose, heat quantity, pressure), and controllability of the amount of generated outgas may be improved.

Even the gas generating step using such the light curable resin which generates gas by predetermined processing (for example, at least one of light irradiation, heating and increasing/reducing pressure) is performed, the mold is released from the each region by mold-releasing force equal to or less than a certain level, and the occurrence of demolding defect is suppressed. In this case, from the point of controllability, it is desirable to use a light curable resin in which the amount of generated gas changes in accordance with level of irradiation dose, heat quantity or pressure, rather than a light curable resin alternative of gas generation and not gas generation in accordance with light irradiation, heating or pressing is applied or not.

In addition, the region (first region) with a pattern formed thereon in which the pattern tends to generate demolding defect such as a fine pattern or a high density pattern generate larger amount of gas than the region (second region) with a pattern formed thereon in which the pattern less tends to generate demolding defect compared with the pattern formed on the first region (for example, a pattern having large size (non-fine pattern) than the fine pattern, or a pattern having lower density (low density pattern) than the high density pattern), and the magnitude relation of the amount of generated gas is realize by the above mentioned predetermined processing (for example, at least one of light irradiation, heating and increasing/reducing pressure), but the method for realizing the magnitude relation is not limited to the processing.

Eleventh Embodiment

FIG. 41 to FIG. 44 are sectional views showing method for forming a pattern using an imprint method according to a second embodiment.

[FIG. 41]

A shot of light curable resin 2e (fourth light curable resin) is applied on the substrate 1 to be processed by ink jet method. When the ink jet method is used, the amount of light curable resin 2e in liquid form for one shot is generally calculated based on pattern information of the mold.

Here, the light curable resin 2e used in the present embodiment contains compound having protecting group such as tertiary butoxycarbonyl group (t-BOC group) or tertiary butyl group (t-Bu group), and acid-photogenerating agent which generates acid by UV light irradiation. The acid-photogenerating agent is, for example, onium salt.

[FIG. 42]

The substrate 1 is aligned with a mold 10.

Here, for example, a memory cell pattern of a memory device is formed on the center portion of the mold 10. The memory cell pattern includes lines and spaces. A peripheral circuit pattern is formed outside the memory cell pattern, in addition, a dicing region is formed outside the peripheral circuit pattern in which the dicing region is to be a stage for cutting the substrate into chips. Alignment marks for aligning position are formed in the dicing region.

[FIG. 43]

The mold 10 is contacted with the light curable resin 2e. The light curable resin 2e is cured by irradiating the light curable resin 2e with light 3 via the mold 10. At this time, the acid is generated by the acid-photogenerating agent in the light curable resin 2e. The light 3 is ArF light, KrF light, or i-beam such as i ray.

[FIG. 44]

The substrate 1 is heated up to 100° C. for instance. This heating causes catalysis of the acid which is generated by photogenerating agent, the catalysis causes removal of the protecting group in the light curable resin 2e, and hence the outgas 4 is generated.

Thereafter, the demolding is performed. At this time, the adhesion force between the light curable resin 2e and the mold 10 is weaken by outgas. For this reason, the mold 10 can be released from the light curable resin 2 by force (pull force) smaller than before. Therefore, the occurrence of defect such as tear of pattern having high aspect ratio (pattern tearing) is suppressed.

Thereafter, as in the first embodiment, the step of removing of residual film, the step of etching of substrate to be processed and so on are performed.

In the present embodiment, all shot regions on the substrate 1 are coated with the light curable resin 2e, but a part of the shot regions, that is, only the regions having relatively large mold-releasing force (regions relatively hard to generate demolding defect) may be coated with the light curable resin 2e, and other regions having relatively low mold-releasing force may be coated with ordinary light curable resin (fifth light curable resin). That is, the present embodiment may be applied to the imprint method which regulates the gas generation for each of the shot regions (first region, second region) whether the gas should be generated or not as in the tenth embodiment described before or as in a fourteenth or fifteenth embodiment that will be described later.

Twelfth Embodiment

FIG. 45 to FIG. 47 are sectional views showing method for forming a pattern using an imprint method according to a twelfth embodiment.

The present embodiment differs from the first to eleventh embodiment in the use of a mold 10a made of ice or solid carbon dioxide.

[FIG. 45]

A shot of light curable resin 2e is applied on the substrate 1 to be processed by ink jet method, thereafter the substrate 1 is aligned with a mold 10.

[FIG. 46]

The mold 10 is contacted with the light curable resin 2e. At this time, it is desired that the substrate 1 is keep the temperature lower than the melting point of the mold 10a (melting point of ice or dry ice). Thereby, the patterns of the mold 10a can easily be maintained in prescribed shapes. The light curable resin 2d is cured by irradiating the light curable resin 2d with light 3 via the mold 10a.

[FIG. 47]

The substrate 1 is heated to melt the mold 10a. The mold 10a may be melted by heating the mold 10a directly. The heating temperature for the mold 10a is equal to or higher than the melting point of the mold 10a. The melted mold 10a (liquid) is removed by means of, for example, spin drying method.

According to the present embodiment, as the mold 10a need not be pulled from the light curable resin 2d, the demolding defect does not occur.

However, as in the conventional manner, the demolding may be performed by pulling the mold 10a from the light curable resin 2d. In this case, the occurrence of demolding defect is suppressed by performing the demolding after reducing the adhesion force between the light curable resin 2d and the mold 10a by melting the mold 10a a little by heating.

An exemplary method of forming the mold 10a will be explained, with reference to FIG. 48 to FIG. 51.

Here, the case that the mold 10a is made of ice will be explained.

[FIG. 48]

A quartz substrate (parent mold) 10a' is prepared, which has a pattern of projections and depressions inverse to that of the mold 10a. This kind of parent mold 10a' can be made by processing a surface of quartz substrate by plasma etching in the same way as the formation of ordinary photo mask.

[FIG. 49]

The parent mold 10a' cooled down to 0° C. or less is disposed above a vessel 50. The vessel 50 can be cooled by cooling mechanism (not shown).

[FIG. 50]

Pure water 51 cooled down to about 0° C. is poured into the vessel 50, thereafter, the parent mold 10a' is immersed to a predetermined depth in the pure water 51 in the vessel 50, and the vessel 50 is cooled by the above not shown cooling mechanism to freeze the pure water 51.

[FIG. 51]

The parent mold 10a' and the frozen pure water (ice) 51 are taken out of the vessel 50, then the ice 51 and the parent mold 10a' are separated from each other, thereby the mold (child mold) made of ice is obtained, which corresponds to the mold 10a.

If made of solid carbon dioxide, the mold 10a can be formed by a method similar to the method described above.

Thirteenth Embodiment

FIG. 52 to FIG. 55 are sectional views showing method for forming a pattern using an imprint method according to a thirteenth embodiment.

The present embodiment differs from the first to twelfth embodiments in that the gas dissolved in a light curable resin is vaporized to generate outgas at the time of demolding.

[FIG. 52]

Liquid light curable resin 2d (sixth light curable resin) is exposed to a high pressure atmosphere 60 of gas such as air, nitrogen, carbon dioxide, He or Ar, thereby gas 61 is dissolved in the light curable resin 2d.

[FIG. 53]

In the high pressure atmosphere 60, a substrate 1 to process is coated with the light curable resin 2d in which the gas 61 is dissolved. The method of coating the substrate 1 is, for example, spin coat method or ink jet method. The coating method may be combined with a method using a squeegee. In this case, the light curable resin 2d having a desired thickness can be formed easily.

[FIG. 54]

In the high pressure atmosphere 60, the mold 10 is contacted with the light curable resin 2d, then the light curable resin 2d is irradiated with the light 3 via the mold 10, thereby the light curable resin 2d is cured.

[FIG. 55]

The atmosphere is from the high pressure atmosphere 60 to lower pressure atmosphere 62. As a result, the gas 61 dissolved in the light curable resin 2d is vaporized, and gas 61 is accumulated at the interface between the light curable resin 2d and the mold 10. Since the gas (outgas) 61 accumulated at the interface weakens the adhesion force between the light curable resin 2d and the mold 10, the demolding is performed by force smaller than before. Therefore, the occurrence of demolding defect is suppressed.

In the present embodiment, all shot regions on the substrate 1 are coated with the light curable resin 2d, but a part of the shot regions, that is, only the regions having relatively large mold-releasing force (regions relatively hard to generate demolding defect) may be coated with the light curable resin 2d, and other region having relatively low mold-releasing force may be coated with ordinary light curable resin (seventh light curable resin). That is, the present embodiment may be applied to the imprint method which regulates the gas generation for each of the shot regions (first region, second region) whether the gas should be generated or not as in the tenth embodiment described before or as in a fourteenth or fifteenth embodiment that will be described later.

Fourteenth Embodiment

Figure 56:
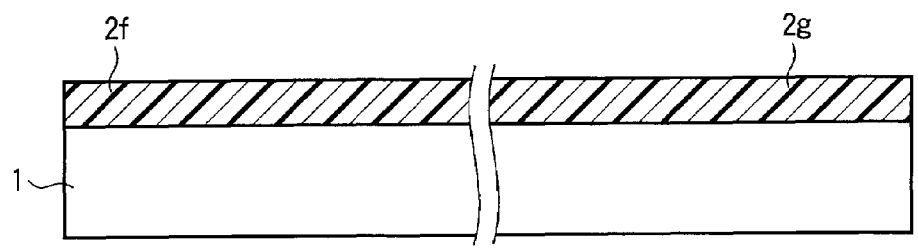
FIG. 56 is a sectional view showing method for forming a pattern using an imprint method according to a fourteenth embodiment.
Figure 57:
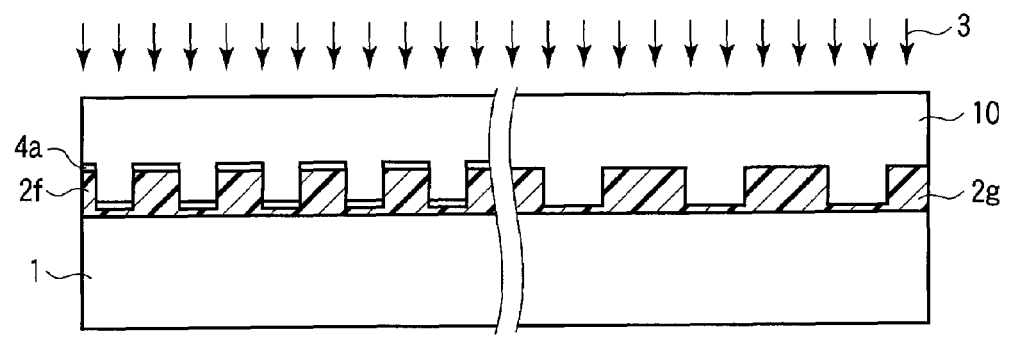
FIG. 57 is a sectional view showing the method for forming the pattern using the imprint method according to the fourteenth embodiment following FIG. 56.

FIG. 56 and FIG. 57 are sectional views showing method for forming a pattern using an imprint method according to a fourteenth embodiment.

[FIG. 56]

In the present embodiment, two types of light curable resins (first light curable resin 2f and second light curable resin 2g) are used.

The first light curable resin 2f (second light curable resin) is cured and generates gas when it is irradiated with ultraviolet rays.

The second light curable resin 2g (third light curable resin) is only cured when it is irradiated with ultraviolet rays.

The material of first light curable resin 2f comprises acryl monomer containing photopolymerization initiator and benzophenone compound coupled with naphthoquinone azide (DNQ) added in the acryl monomer.

The material of second light curable resin 2g comprises acryl monomer containing photopolymerization initiator.

The two light curable resins 2f and 2g can be supplied by two independent liquid lines, respectively, which are provided in a coating apparatus of an imprint apparatus. An ink jet nozzle is attached to the distal end of each liquid line.

The imprint apparatus determines appropriate distribution of the light curable resin and type of the light curable resin according to the size of pattern of the mold.

More specifically, the first light curable resin 2f is sued for a region on which a fine pattern is formed, the second light curable resin 2g is sued for other region.

The first region having formed the fine pattern thereon has large mold-releasing force since the contact area between the mold and the light curable resin is large, therefore the first light curable resin 2f capable of generating gas is used for the first region. The other region (second region) has relatively small mold-releasing force, therefore the second light curable resin 2g incapable of generating gas is used for the second region.

[FIG. 57]

The mold 10 is contacted with the light curable resins 2f and 2g, thereafter, the light curable resin 2f and 2g are cured by irradiating the light curable resin 2f and 2g with the light 3 (here, UV light) via the mold 10.

At this time, DNQ in the light curable resin 2f is decomposed by the irradiation of light 3, and the outgas (nitrogen gas) 4a is generated from the light curable resin 2f. The outgas 4a is accumulated between the light curable resin 2f and the mold 10. Thereby, the adhesion force between the light curable resin 2f and the mold 10 at the time of demolding is weaken, and the occurrence of demolding defect is suppressed.

In addition, as the adhesion force is weaken, the mold 10 can be prevented from dropping from the mold-holding mechanism of the imprint apparatus at the time of demolding. Since the mold is expensive, it is important to prevent the molding from being damaged by the dropping in a point of reducing manufacturing cost.

The amount of outgas to be generated is controlled such that the influence of the outgas on the precision of pattern (shape and size) is restricted within a tolerant degree.

On the other hand, the outgas is not generated from the second light curable resin 2g. Therefore, the pattern formed of the second light curable resin 2g has high precision.

In FIG. 56 and FIG. 57, only one region (first region) and one other region (second region) except the one region are illustrated, but in fact there are a plurality of first regions and a plurality of second regions, and the steps shown in FIG. 56 and FIG. 57 are performed for each of the plurality of first regions and the plurality of second regions. This holds true of the modification to be described below, too.

FIG. 58 shows a modification of the present embodiment. In the present embodiment, the substrate 1 is coated with the light curable resins 2f and 2g, but in this modification, the pattern surface of the mold 10 is coated with the light curable resins 2f and 2g. Next, the substrate 1 is laid on the light curable resins 2f and 2g, and the light curable resins 2f and 2g are irradiated with light 3 via the mold 10. Thereafter, known steps such as demolding are performed. This modification (example of the mold is coated with light curable resin) can be applied to the third embodiment described above and to a fifteenth embodiment that will be described below.

Fifteenth Embodiment

FIG. 59 is a sectional view showing method for forming a pattern using an imprint method according to a second embodiment.

[FIG. 59]

The present embodiment differs from the fourteenth embodiment in that the first light curable resin 2f is used for a region (dense pattern region) on which a high density pattern is formed, the second light curable resin 2g is sued for a region (sparse pattern region) on which a low density pattern is formed.

The dense pattern region is, for example, a region where an L/S (1:1) pattern is formed. The dense pattern region has large mold-releasing force since the contact area between the mold and the light curable resin is large, therefore the first light curable resin 2f capable of generating gas is used for the dense pattern region.

The sparse pattern region is, for example, a region where an isolated line (isolated space) or a contact hole is formed. The sparse pattern region does not have large mold-releasing force, therefore the second light curable resin 2g incapable of generating gas is used for the sparse pattern region.

The mold 10 is contacted with the light curable resins 2f and 2g, thereafter, the light curable resin 2f and 2g are cured by irradiating the light curable resin 2f and 2g with the light 3 (here, UV light) via the mold 10.

At this time, outgas (nitrogen gas) 4a is generated from the light curable resin 2f, and the adhesion force in the dense pattern region is weaken. Thereby, the mold 10 can be prevented from dropping from the mold-holding mechanism of the imprint apparatus at the time of demolding.

In addition, according to an inspection of defect of the pattern formed of the light curable resins 2f and 2d after the demolding, it is found that the number of demolding defect is decreased compared with conventional one. The reason for this may be considered as follows.

As the adhesion force in the density pattern region is weakened, the difference of mold-releasing force between the dense pattern region and the sparse pattern region is decreased. As a result, the stress generated in the pattern plane of mold 10 at the time of demolding is reduced, hence the deformation of the pattern plane of mold 10 is suppressed, which may be cause of generation of demolding defect.

Sixteenth Embodiment

Figure 61:
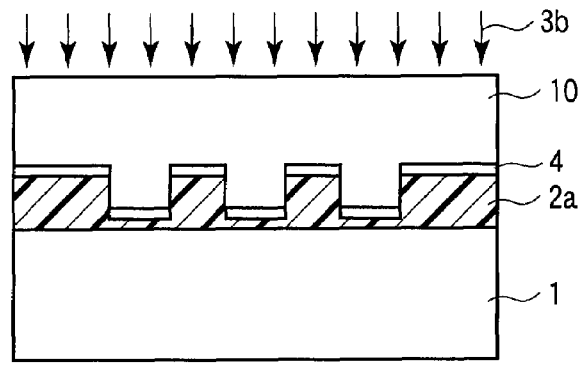
FIG. 61 is a sectional view showing the method for forming the pattern using the imprint method according to the sixteenth embodiment following FIG. 60.

FIG. 60 and FIG. 61 are sectional views showing method for forming a pattern using an imprint method according to a second embodiment.

[FIG. 60]

As in the third embodiment, the step of coating by light curable resin 2a to the step (FIG. 17, FIG. 18) of imprinting are preformed, thereafter the light curable resin 2a is irradiated with a first light 3a via the mold 10.

The first light 3a has a center wavelength that corresponds to that of visible light. The source of the first light 3a is, for example, a xenon lamp of high output power. By the irradiation of first light 3a, the light curable resin 2a causes hardening reaction and is cured.

At this time, as naphthoquinone azide compound is not so much decomposed by visible light, the outgas is not generated from the light curable resin 2a. therefore, no bubbles will be formed in the light curable resin 2a.

[FIG. 61]

The light curable resin 2a is cured by irradiating the light curable resin 2a with the second light 3b via the mold 10.

The second light 3b is ultraviolet rays, its center wavelength is, for example, 365 nm. The source of second light 3b is, for example, a mercury lamp. By the second light 3b, naphthoquinone azide is effectively decomposed into indenecarbonic acid. As a result, outgas (nitrogen gas) is generated from the light curable resin 2a. Therefore, in the present embodiment, the occurrence of demolding defect is suppressed as in the third embodiment.

At this time, the nitrogen gas is compressed in the cured light curable resin 2a by pressure of the solid, hence gap of the nitrogen gas is not formed in the light curable resin 2a. Only nitrogen gas generated near the surface region of the light curable resin 2a is released as outgas.

Seventeenth Embodiment

Figure 62:
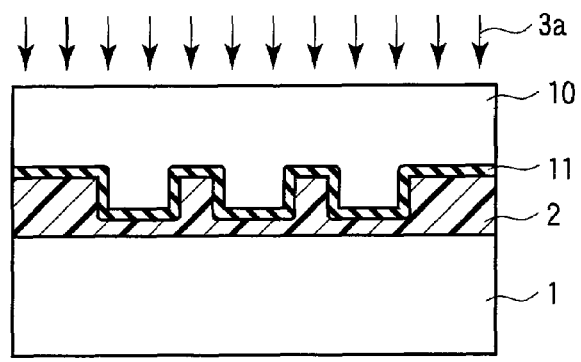
FIG. 62 is a sectional view showing method for forming a pattern using an imprint method according to a seventeenth embodiment.
Figure 63:
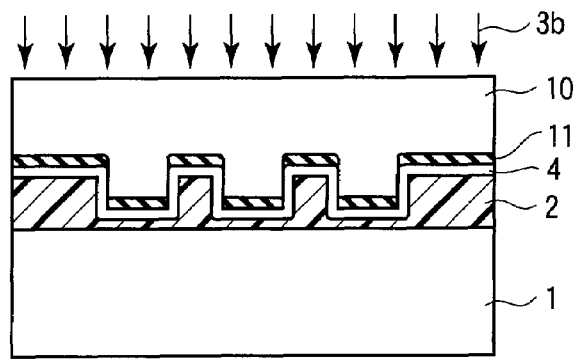
FIG. 63 is a sectional view showing the method for forming the pattern using the imprint method according to the seventeenth embodiment following FIG. 62.

FIG. 62 and FIG. 63 are sectional views showing method for forming a pattern using an imprint method according to a seventeenth embodiment.

[FIG. 62]

As in the second embodiment, the step of coating by light curable resin 2 to the step (FIG. 12, FIG. 13) of imprinting are preformed, thereafter the light curable resin 2 is irradiated with a first light 3a via the mold 10. The source of first light 3a is the xenon lamp of high output power, as in the sixteenth embodiment.

[FIG. 63]

The light curable resin 2 is irradiated with the second light 3b via the mold 10.

The second light 3b is ultraviolet rays having a wavelength equal to or shorter than 400 nm. The source of second light 3a is the mercury lamp, as in the sixteenth embodiment.

At this time, the photocatalyst layer 11 expresses the catalysis by the irradiation of the second light 3b, the surface of a portion of light curable resin 2, which contacts the photocatalyst layer 11, is decomposed, and hence the outgas 4 is generated from the surface of the light curable resin 2. Therefore, in the present embodiment, the occurrence of demolding defect is suppressed as in the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imprint method comprising:
    applying first and second light curable resins on first and second regions, respectively, of a substrate to be processed, the first region being selected to be with a predetermined pattern after the substrate is processed, and the second region being selected to be without the predetermined pattern after the substrate is processed, the first light curable resin being a material that generates gas when irradiated with light, the second light curable resin being a material that does not generate gas when irradiated with light;
    contacting an imprint mold with the first and second light curable resins;
    curing the first and second light curable resin resins by irradiating the first and second light curable resins with light passing through the imprint mold;
    generating gas from the first light curable resin applied on the first region of the substrate due to the irradiating with light, and forming the predetermined pattern in the first region by separating the imprint mold from the first and second light curable resins after the gas is generated.

2. The imprint method according to claim 1, wherein the predetermined pattern has higher density than a pattern to be formed in the second region.

3. The imprint method according to claim 1, wherein the predetermined pattern has larger dimensions than a pattern to be formed in the second region.

4. The imprint method according to claim 1, wherein the first region is a region in which stronger force is required than in the second region for separating the imprint mold from the light curable resin.

5. An imprint method comprising:
applying a light curable resin on a substrate to be processed, the substrate including first and second regions on which the light curable resin is applied, the first region being selected to be with a predetermined pattern after the substrate is processed, and the second region being selected to be without the predetermined pattern after the substrate is processed;
providing a patterned imprint mold having a coating film provided on only a portion of the pattern surface, the film capable of generating gas when exposed to radiation;
contacting the imprint mold with the light curable resin;
irradiating the light curable resin with light passing through the imprint mold, thereby curing the light curable resin and generating gas only at the portion of the pattern surface coated by the film.

6. The imprint method according to claim 1, wherein the first light curable resin has an ESCAP structure.

7. The imprint method according to claim 1, wherein the forming the predetermined pattern comprises etching the substrate using residual light curable resin on the substrate as a mask, the residual light curable resin is the first light curable resin remaining on the substrate after the separating the imprint mold from the light curable resin.

8. The imprint method according to claim 1, further comprising evaluating adhesion force between the first and second light curable resins and the substrate after the gas is generated.

9. The imprint method according to claim 1, wherein the light first curable resin is a light curable resin including naphthoquinone diazide compound.

10. The imprint method according to claim 1, wherein the separating the imprint mold from the first and second light curable resins is performed after the first and second light curable resins and the imprint mold are cooled.

11. The imprint method according to claim 1, wherein gas is dissolved in the first light curable resin.

12. The imprint method according to claim 11, wherein the gas dissolved in the first light curable resin is air, nitrogen, carbon dioxide, helium, neon, or argon.

13. The imprint method according to claim 1, wherein the pattern is a pattern constituting an optical device, a pattern constituting a semiconductor device or a pattern constituting a DNA chip.

* * * * *

UNITED STATES PATENT AND TRADEMARK OFFICE
CERTIFICATE OF CORRECTION

PATENT NO.        : 8,419,995 B2
APPLICATION NO.   : 12/563461
DATED             : April 16, 2013
INVENTOR(S)       : Yoneda et al.

It is certified that error appears in the above-identified patent and that said Letters Patent is hereby corrected as shown below:

In the Claims

Claim 9, column 22, line 14, change "light first" to --first light--.

Signed and Sealed this
Second Day of July, 2013

Teresa Stanek Rea
*Acting Director of the United States Patent and Trademark Office*